(12) United States Patent
Muraoka et al.

(10) Patent No.: US 8,395,930 B2
(45) Date of Patent: *Mar. 12, 2013

(54) METHOD OF PROGRAMMING VARIABLE RESISTANCE ELEMENT AND NONVOLATILE STORAGE DEVICE

(75) Inventors: Shunsaku Muraoka, Osaka (JP); Takeshi Takagi, Kyoto (JP); Satoru Mitani, Osaka (JP); Koji Katayama, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/596,154

(22) Filed: Aug. 28, 2012

(65) Prior Publication Data

US 2012/0320661 A1 Dec. 20, 2012

Related U.S. Application Data

(63) Continuation of application No. 12/994,462, filed as application No. PCT/JP2010/002125 on Mar. 25, 2010, now Pat. No. 8,279,658.

(30) Foreign Application Priority Data

Mar. 25, 2009 (JP) ................................. 2009-073296

(51) Int. Cl.
*G11C 11/21* (2006.01)
(52) U.S. Cl. ........................................ 365/148; 365/163
(58) Field of Classification Search .................. 365/148, 365/163
See application file for complete search history.

(56) References Cited

U.S. PATENT DOCUMENTS

| | | | |
|---|---|---|---|
| 6,204,139 | B1 | 3/2001 | Liu et al. |
| 7,369,431 | B2 | 5/2008 | Muraoka et al. |
| 7,525,786 | B1 | 4/2009 | Douglas |
| 7,558,099 | B2 | 7/2009 | Morimoto |
| 2004/0245557 | A1 | 12/2004 | Seo et al. |
| 2007/0114587 | A1 | 5/2007 | Seo et al. |
| 2007/0115714 | A1 | 5/2007 | Muraoka et al. |
| 2008/0259678 | A1 | 10/2008 | Muraoka et al. |
| 2009/0046495 | A1 | 2/2009 | Shimaoka et al. |
| 2009/0147558 | A1 | 6/2009 | Tamai et al. |

(Continued)

FOREIGN PATENT DOCUMENTS

| | | |
|---|---|---|
| JP | 2004-363604 | 12/2004 |
| JP | 2007-515026 | 6/2007 |

(Continued)

OTHER PUBLICATIONS

International Search Report issued Jun. 22, 2010 in International (PCT) Application No. PCT/JP2010/002125.

(Continued)

*Primary Examiner* — Hoai V Ho
*Assistant Examiner* — Tri Hoang
(74) *Attorney, Agent, or Firm* — Wenderoth, Lind & Ponack, LLP.

(57) ABSTRACT

A method includes applying a first polarity writing voltage pulse to a metal oxide layer to change its resistance state from high to low into a write state, applying a second polarity erasing voltage pulse different from the first polarity to the metal oxide layer to change its resistance state from low to high into an erase state, and applying an initial voltage pulse having the second polarity to the metal oxide layer before first application of the writing voltage pulse, to change an initial resistance value of the metal oxide layer. R0>RH>RL and |V0|>|Ve|≧|Vw| are satisfied where R0, RL, and RH are the resistance values of the initial, write, and erase states, respectively, of the metal oxide layer, and V0, Vw, and Ve are voltage values of the initial, writing, and erasing voltage pulses, respectively.

9 Claims, 10 Drawing Sheets

U.S. PATENT DOCUMENTS

| | | |
|---|---|---|
| 2009/0283736 A1 | 11/2009 | Kanzawa et al. |
| 2010/0046273 A1 | 2/2010 | Azuma et al. |
| 2010/0090193 A1 | 4/2010 | Mikawa et al. |

FOREIGN PATENT DOCUMENTS

| | | |
|---|---|---|
| WO | 2008/047711 | 4/2008 |
| WO | 2008/149484 | 12/2008 |
| WO | 2009/001534 | 12/2008 |
| WO | 2009/050833 | 4/2009 |
| WO | 2009/072213 | 6/2009 |
| WO | 2009/107370 | 9/2009 |
| WO | 2009/154266 | 12/2009 |

OTHER PUBLICATIONS

A. Odagawa et al., "Electroforming and resistance-switching mechanism in a magnetite thin film", Applied Physics Letters 91, 133503 (2007).

S. Muraoka et al., "Fast switching and long retention Fe-O ReRAM and its switching mechanism", Electron Devices Meeting, 2007. IEDM 2007. IEEE International Dec. 10-12, 2007, pp. 779-782.

Z. Wei et al., "Improvement of ReRAM retention properties in Pt/FeOx/Pt heterostructures by combining unipolar and bipolar switching modes", MRS2008 Spring meeting.

Z. Wei et al., "Highly Reliable TaOx ReRAM and Direct Evidence of Redox Reaction Mechanism", Electron Devices Meeting, 2008. IEEE 2008. IEEE International Dec. 15-17, 2008.

Thickness of second tantalum oxide layer 3b = 6.2 nm a# METHOD OF PROGRAMMING VARIABLE RESISTANCE ELEMENT AND NONVOLATILE STORAGE DEVICE This is a Continuation Application of U.S. application Ser. No. 12/994,462, Nov. 24, 2010 (now, U.S. Pat. No. 8,279,658, issued Oct. 2. 2012), which is the U.S. National Stage of International Application No. PCT/JP2010/002125, filed Mar. 25, 2010, which is hereby incorporated by reference in its entirety.

TECHNICAL FIELD

The present invention relates to a method of programming a variable resistance element in which a resistance value changes based on an electric pulse provided, and a nonvolatile storage device that performs the method.

BACKGROUND ART

With the development in digital technologies for electronic devices in recent years, demands for a non-volatile variable resistance element which has a greater capacity, higher writing and reading speed, and longer-life and which consumes lower power in writing have been increased, for storing data such as images. To meet such demands, efforts in miniaturizing flash memories using existing floating gates are said to have limitations.

A non-volatile variable resistance element using perovskite material ($Pr_{(1-x)}Ca_xMnO_3$ [PCMO], $LaSrMnO_3$ [LSMO], and $GdBaCo_xO_y$ [GBCO], for example) has been proposed as a first conventional technique that could possibly meet the demands above (See PTL 1). With this technique, voltage pulses (a short-duration waveform voltage) having different polarities are applied to the perovskite material to increase or decrease the resistance value and the resistance value that changes is associated with data, thereby storing the data.

There also is a non-volatile variable resistance element which utilizes the characteristics of a film of transition metal oxide ($NiO$, $V_2O$, $ZnO$, $Nb_2O_5$, $TiO_2$, $WO_3$, or $CoO$), that is, a resistance value changes when voltage pulses having different pulse widths are applied to the film of the transition metal oxide, as a second conventional technique that enables switching resistance values using a homopolarity voltage pulse (See PTL 2). In another implemented configuration of the variable resistance element using a transition metal oxide film, cross-point type memory arrays using a diode are stacked.

[Citation List]
[Patent Literature]
[PTL 1] U.S. Pat. No. 6,204,139
[PTL 2] Japanese Unexamined Patent Application Publication No. 2004-363604

SUMMARY OF INVENTION

[Technical Problem]

However, problems such as insufficient operation stability and reproducibility have been found in the first conventional technique. In addition, there is another problem that, since oxide crystal having a perovskite configuration such as $Pr_{0.7}Ca_{0.3}MnO_3$ generally needs high temperature of 650 degrees Celsius to 850 degrees Celsius for crystallization, introduction of the oxide crystal to semiconductor manufacturing processing causes deterioration in other materials.

In addition, the second conventional technique has a problem, that is, a high-speed operation is very difficult due to the fact that the pulse width of a voltage at the time of changing the resistance value from a low resistance state to a high resistance state is significantly long, that is, equal to or longer than 1 ms, and thus implementation of a variable resistance element capable of stably performing a high-speed operation is desired.

The present invention has been conceived in view of the above-described circumstances. Thus, a primal object of the present invention is to provide: a method of programming a variable resistance element that can be manufactured at low temperature, which can change the resistance of the variable resistance element stably at high speed; and a nonvolatile storage device that performs the method.

[Solution to Problem]

In order to solve the above-described problems, a method of programming a variable resistance element according to an aspect of the present invention is a method of programming a variable resistance element including: a first electrode; a second electrode; and a metal oxide disposed between the first electrode and the second electrode and having a resistance value that increases or decreases according to an electric pulse applied, wherein the metal oxide includes, in a stacking structure, a first oxide layer connected to the first electrode and a second oxide layer connected to the second electrode, the second oxide layer having an oxygen content percentage higher than that of the first oxide layer, the method of programming a variable resistance element comprising: applying a writing voltage pulse having a first polarity between the first and second electrodes to change the resistance state of the metal oxide from high to low so as to render the resistance state a write state; applying an erasing voltage pulse having a second polarity different from the first polarity between the first and second electrodes to change the resistance state of the metal oxide from low to high so as to render the resistance state an erase state; and applying an initial voltage pulse having the second polarity between the first and second electrodes before the applying of a writing voltage pulse is performed for a first time, to change a resistance value of an initial state of the metal oxide, wherein R0>RH>RL and |V0|>|Ve|≧|Vw| are satisfied where R0 is the resistance value of the initial state of the metal oxide, RL is the resistance value of the write state, RH is the resistance value of the erase state, V0 is a voltage value of the initial voltage pulse, Vw is a voltage value of the writing voltage pulse, and Ve is a voltage value of the erasing voltage pulse. In the method of programming a variable resistance element according to this aspect, R0>R1≧RH>RL may be satisfied where R1 is the resistance value of the metal oxide after the applying of an initial voltage pulse is performed.

Furthermore, in the method of programming a variable resistance element according to the above-described aspect, it is preferable that the first oxide layer includes a tantalum oxide having a composition represented by $TaO_x$ where $0.8 \leq x \leq 1.9$, and the second oxide layer includes a tantalum oxide having a composition represented by $TaO_y$ where $2.1 \leq y \leq 2.5$.

Furthermore, a nonvolatile storage device according to another aspect of the present invention comprises: a first electrode; a second electrode; a variable resistance element including a metal oxide disposed between the first electrode and the second electrode and having a resistance value that increases or decreases according to an electric pulse applied between the first electrode and the second electrode; and a pulse voltage applying unit configured to apply a predetermined pulse voltage to the variable resistance element, wherein the metal oxide includes, in a stacking structure, a first oxide layer connected to the first electrode and a second oxide layer connected to the second electrode, the second oxide layer having an oxygen content percentage higher than that of the first oxide layer, the pulse voltage applying unit is configured to (i) apply a writing voltage pulse having a first polarity between the first and second electrodes to change a resistance state of the metal oxide from high to low so as to render the resistance state a write state, (ii) apply an erasing voltage pulse having a second polarity different from the first polarity between the first and second electrodes to change the resistance state of the metal oxide from low to high so as to render the resistance state an erase state, and (iii) apply an initial voltage pulse having the second polarity between the first and second electrodes before the writing voltage pulse is applied for a first time to change a resistance value of an initial state of the metal oxide, and R0>RH>RL and |V0|>|Ve|≧|Vw| are satisfied where R0 is the resistance value of the initial state of the metal oxide, RL is the resistance value of the write state, RH is the resistance value of the erase state, V0 is a voltage value of the initial voltage pulse, Vw is a voltage value of the writing voltage pulse, and Ve is a voltage value of the erasing voltage pulse In the nonvolatile storage device according to this aspect, R0>R1≧RH>RL may be satisfied where R1 is the resistance value of the metal oxide after the initial voltage pulse is applied Furthermore, in the nonvolatile storage device according to the above-described aspect, it is preferable that the first oxide layer includes a tantalum oxide having a composition represented by $TaO_x$ where $0.8 \leq x \leq 1.9$, and the second oxide layer includes a tantalum oxide having a composition represented by $TaO_y$ where $2.1 \leq y \leq 2.5$ Furthermore, it is preferable that the nonvolatile storage device according to the above-described aspect further comprises a current steering element electrically connected to the first electrode or the second electrode. The current steering element may be a transistor or a diode.

[Advantageous Effects of Invention]

With the method of programming a variable resistance element according to the present invention, it is possible to change the resistance of a variable resistance element stably at high speed. In addition, with the nonvolatile storage device according to the present invention which performs the method of programming, it is possible to implement a storage device capable of operating stably at high speed.

DESCRIPTION OF EMBODIMENTS

The following describes preferred embodiments according to the present invention with reference to the drawings.
(Embodiment 1)
[Configuration of Variable Resistance Element]

First, a configuration of a variable resistance element according to Embodiment 1 of the present invention is described.

Figure 1:
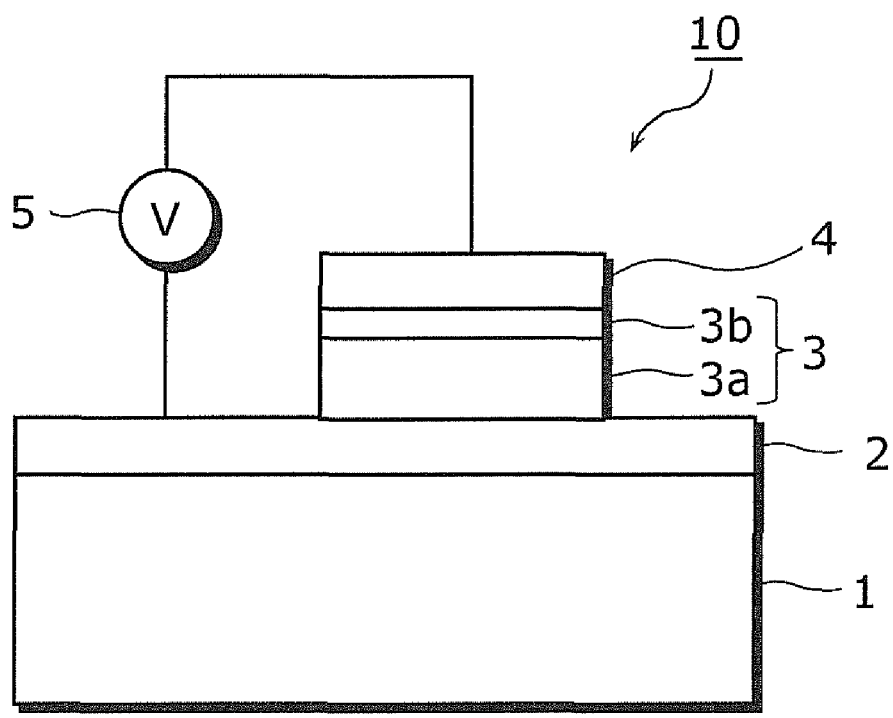
FIG. 1 is a pattern diagram which shows an example of a configuration of a variable resistance element according to Embodiment 1 of the present invention.

FIG. 1 is a pattern diagram which shows an example of the configuration of the variable resistance element according to Embodiment 1 of the present invention. As shown in FIG. 1, a variable resistance element 10 according to the present embodiment includes: a substrate 1; a first electrode 2 formed on the substrate 1; a metal oxide layer 3 formed on the first electrode 2; and a second electrode 4 formed on the metal oxide layer 3. The first electrode 2 and the second electrode 4 are electrically connected to the metal oxide layer 3.

It is to be noted that the first electrode 2 may have the same size as the second electrode 4, and the respective electrodes may be arranged upside down or side-by-side, with respect to the metal oxide layer.

The substrate 1 is a silicon substrate on which a circuit element such as a transistor is provided, for example. Each of the first electrode 2 and the second electrode 4 is made using, for example, one or more materials among gold (Au), platinum (Pt), iridium (Ir), copper (Cu), tungsten (W), and tantalum nitride (TaN).

The metal oxide layer 3 includes a first tantalum oxide layer 3*a* and a second tantalum oxide layer 3*b* stacked therein. Here, the oxygen content percentage of the second tantalum oxide layer 3*b* is higher than the oxygen content percentage of the first tantalum oxide layer 3*a*

In the case where the composition of the first tantalum oxide layer 3*a* is represented by $TaO_x$ where $0.8 \leq x \leq 1.9$ and the composition of the second tantalum oxide layer 3*b* is represented by $TaO_y$ where $2.1 \leq y \leq 2.5$, the resistance value of the metal oxide layer 3 successfully changed stably at high speed. Thus, it is preferable that x and y are within the above-stated range.

Change in the resistance value is recognized when the thickness of the metal oxide layer 3 is 1 μm or less, however, it is preferable that the thickness of the variable resistance layer 3 is 200 nm or less. The reason for this is this configuration facilitates fabrication when photolithography is used in patterning processing, and further, makes it possible to reduce voltage values of voltage pulses necessary for changing the resistance value of the metal oxide layer 3. On the other hand, in order to further surely prevent a breakdown (insulation breakdown) in application of voltage pulses, it is preferable that the thickness of the metal oxide layer 3 is at least 5 nm or more.

Furthermore, too thick second tantalum oxide layer 3*b* is disadvantageous with a too high initial resistance value and the like, and too thin second tantalum oxide layer 3*b* is also disadvantageous because stable resistance change cannot be obtained, and thus approximately at least 1 nm and not more than 8 nm is preferable.

When the variable resistance element 10 configured as above is operated, the first electrode 2 and the second electrode 4 are electrically connected respectively to different terminals of a power source 5. The power source 5 serves as an electric pulse applying device for programming the variable resistance element 10, and can apply, between the first electrode 2 and the second electrode 4, electric pulses (voltage pulses) having predetermined polarities, voltages, and time widths.

It is assumed in the following description that voltage values of voltage pulses applied between the electrodes are determined by a potential of the second electrode 4 with reference to the first electrode 2.

[Manufacturing Method of Variable Resistance Element]

The following describes a manufacturing method of variable resistance element 10 using tantalum oxide.

First, the first electrode 2 having a thickness of 0.2 μm is formed on the substrate 1 by a sputtering method or the like. Then, a tantalum oxide layer is formed on the first electrode 2 using a so-called reactive sputtering with which a Ta target is treated with sputtering in argon gas and oxygen gas. Here, the oxygen content percentage in the tantalum oxide layer can be adjusted easily by changing a flow ratio of the oxygen gas to the argon gas. It is to be noted that the substrate does not have to be heated and the temperature of the substrate may be set at an ambient temperature.

Next, a top surface of the tantalum oxide layer formed as stated above is reformed by oxidation. Alternatively, a layer having a higher oxygen content percentage is formed by the sputtering method, using a tantalum oxide ($Ta_2O_5$, for example) target having high oxygen content percentage. With this, a region (a second region) having an oxygen content percentage higher than a region (a first region) which is not oxidized in the tantalum oxide layer is formed on the surface of the tantalum oxide layer previously formed.

The first region and the second region correspond to the first tantalum oxide layer 3*a* and the second tantalum oxide layer 3*b*, respectively, and the first tantalum oxide layer 3*a* and the second tantalum oxide layer 3*b* formed as described above constitute the metal oxide layer 3.

Next, the second electrode 4 having a thickness of 0.2 μm is formed by the sputtering method on the metal oxide layer 3 obtained as described above, so that the variable resistance element 10 is obtained.

It is to be noted that a size and a shape of each of the first electrode 2, the second electrode 4, and the metal oxide layer 3 can be adjusted by a mask and a photolithography process. According to the present embodiment, each of the second electrode 4 and the metal oxide layer 3 has dimensions of 0.5 μm×0.5 μm (area of 0.25 μm²), and a portion where the first electrode 2 and the metal oxide layer 3 contact with each other also has dimensions of 0.5 μm×0.5 μm (area of 0.25 μm²).

In addition, the composition of the first tantalum oxide layer 3*a* is represented by $TaO_x$ where $x=1.54$, and the composition of the second tantalum oxide layer 3*b* is represented by $TaO_y$ where $y=2.47$, according to the present embodiment. Further, the metal oxide layer 3 has a thickness of 50 nm, the first tantalum oxide layer 3*a* has a thickness of 45 nm, and the second tantalum oxide layer 3*b* has a thickness of 5 nm.

It is to be noted that while $x=1.54$ and $y=2.47$ are given in the present embodiment, x and y are not limited to the above values. The resistance can change stably just as the variable resistance characteristic according to the present embodiment as long as $0.8 \leq x \leq 1.9$ and $2.1 \leq y \leq 2.5$ are satisfied.

[Operation of Variable Resistance Element]

The following describes an operation of the variable resistance element 10 obtained through the manufacturing process described above.

In the following description, a high resistance state represents a state in which the metal oxide layer 3 has a resistance value indicating a predetermined high value (20000Ω, for example) and a low resistance state represents a state in which the metal oxide layer 3 has a resistance value indicating a predetermined low value (700Ω, for example).

Applying writing voltage pulses which are voltage pulses having negative polarities between the first electrode 2 and the second electrode 4 using the power source 5, reduces the resistance value of the metal oxide layer 3, so that the metal oxide layer 3 changes from the high resistance state to the low resistance state. This is called a writing process in the description below.

On the other hand, applying erasing voltage pulses which are voltage pulses having positive polarities between the first electrode 2 and the second electrode 4 using the power source 5, increases the resistance value of the metal oxide layer 3, so that the metal oxide layer 3 changes from the low resistance state to the high resistance state. This is called an erasing process in the description below.

It is to be noted that, even when voltage pulses having the negative polarities that are the same polarities as the writing voltage pulses are applied between the first electrode 2 and the second electrode 4 when the metal oxide layer 3 is in the low resistance state, the state of the metal oxide layer 3 does not change and the metal oxide layer 3 remains in the low resistance state. Likewise, even when voltage pulses having the positive polarities that are the same polarities as the erasing voltage pulses are applied between the first electrode 2 and the second electrode 4 when the metal oxide layer 3 is in the high resistance state, the state of the metal oxide layer 3 does not change and the metal oxide layer 3 remains in the high resistance state. However, when the resistance value of the metal oxide layer 3 is an initial resistance value (a value higher than the resistance value in the "high resistance state" here), it is possible to reduce the resistance value by applying, between the electrodes, voltage pulses having positive polarities that are the same polarities as the erasing voltage pulses, as described below.

Repeating the writing process and the erasing process described above causes the variable resistance element 10 to operate. It is to be noted that in some cases a so-called overwrite is carried out in which the writing process or the erasing process is continuously performed.

According to the present embodiment, an initial process is performed prior to the first writing process described above. Here, the initial process refers to a process in which initial voltage pulses that are voltage pulses having: the positive polarities same as the erasing voltage pulses and; and voltage values larger than the erasing voltage pulse, are applied between the first electrode 2 and the second electrode 4, thereby changing the initial resistance value (a resistance value in an initial state after manufacturing and shipment) of the metal oxide layer 3.

It is to be noted that, in order to change the resistance state of a variable resistance element in which a variable resistance material is sandwiched between an upper and a lower electrode, a "running-in" process (hereinafter referred to as a forming process) in which a particular electric stimulus is applied between the upper and the lower electrode is conventionally performed in a manufacturing process. More specifically, in order to cause a variable resistance element to operate which potentially is capable of changing its resistance state by receiving an electric pulse having a magnitude of 2V and a pulse width of 100 ns, for example, a process in which an electric pulse having a different magnitude and a width is added several times immediately after manufacturing (for example, a electric pulse having ±3V and 1 μs is added 10 times) corresponds to the forming process. The initial process according to the present embodiment is performed prior to the first writing process after a variable resistance element is manufactured and shipped, and is different from the forming process described above.

According to the present embodiment, $|V0|>|Ve|\geq|Vw|$ is satisfied where V0 represents a voltage value of an initial voltage pulse in the initial process, Vw represents a voltage value of a writing voltage pulse in the writing process, and Ve represents a voltage value of an erasing voltage pulse in the erasing process. It is possible to implement a stable operation for changing resistance as described below, by satisfying the relationship.

Figure 2:
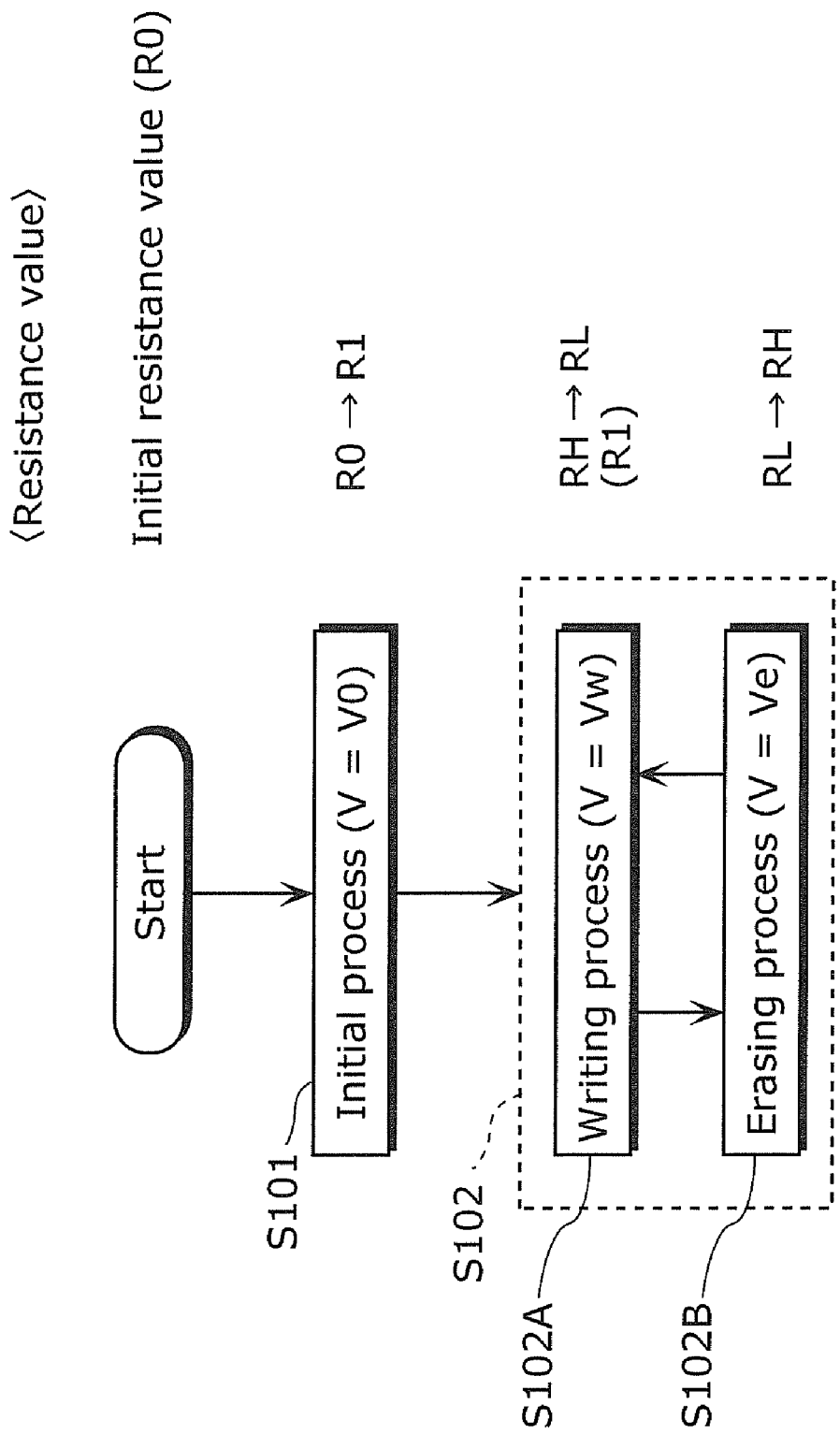
FIG. 2 is a flow chart which shows an operation of the variable resistance element according to Embodiment 1 of the present invention.

FIG. 2 shows a flow chart of an operation of the above-described variable resistance element 10 according to Embodiment 1 of the present invention. First, an initial process is performed using an initial voltage pulse having a voltage value V0 when the resistance value of the metal oxide layer 3 is an initial resistance value R0, that is, prior to performing the first writing process (S101). At this time, the resistance value of the metal oxide layer 3 changes from the initial resistance value R0 to R1.

Subsequently, Step S102 in which the writing process and the erasing process are repeated is executed. More specifically, the writing process using the writing voltage pulse having the voltage value Vw (S102A) and the erasing process using the erasing voltage pulse having the voltage value Ve (S102B) are repeated. Here, the resistance value of the metal oxide layer 3 changes from a high resistance value RH to a low resistance value RL when Step S102A is performed, and the resistance value of the metal oxide layer 3 changes from the low resistance value RL to the high resistance value RH when Step S102B is performed.

It is to be noted that, since the resistance value of the metal oxide layer 3 is R1 as described above when the first writing process is executed (S102A), the resistance value of the metal oxide layer 3 changes from the resistance value R1 to the low resistance value RL in response to applying the writing voltage pulse. In the second writing process or later (S102A), the resistance value of the metal oxide layer 3 changes from the high resistance value RH to the low resistance value RL as described above.

Figure 3:
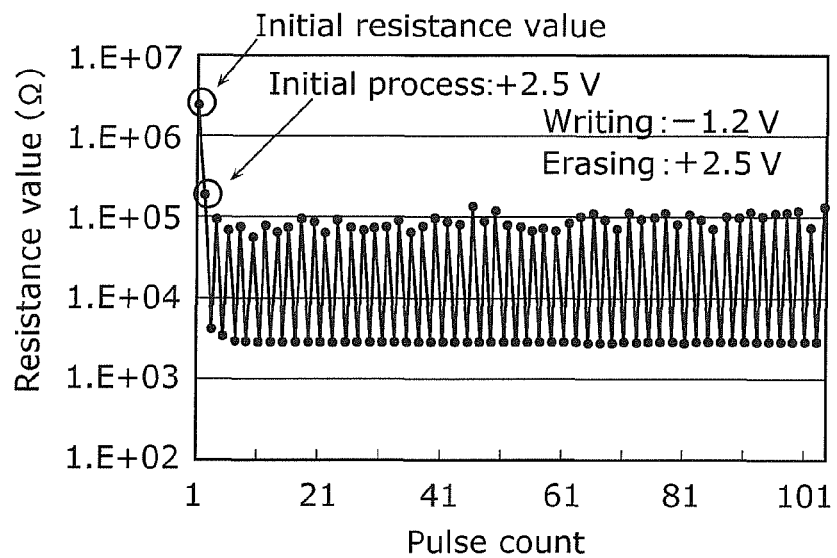
FIG. 3 is a graph which shows an example of change in a resistance state of a metal oxide layer in which a second tantalum oxide layer has a thickness of 5.0 nm.

FIG. 3 is a graph which shows an example of change in a resistance state of a metal oxide layer 3 in which the second tantalum oxide layer 3b has a thickness of 5.0 nm. In this example, the voltage value V0 of the initial voltage pulse in the initial process is +2.5 V. In addition, the voltage value Vw of the writing voltage pulse is −1.2 V and the voltage value Ve of the erasing voltage pulse is +2.0 V. It is to be noted that the pulse width is 100 ns in both cases.

FIG. 3 shows that change in the resistance state of the metal oxide layer 3 is stable. As described above, applying voltage pulses between the first electrode 2 and the second electrode 4 so that $|V0|>|Ve|\geq|Vw|$ is satisfied makes it possible to cause the variable resistance element 10 to stably operate.

The following describes the case where the variable resistance element 10 is used as a memory and performs writing/reading processing for one bit data. It is to be noted that, in the following description, the case where the resistance value of the metal oxide layer 3 is a low resistance value corresponds to "1" and the case where the resistance value is a high resistance value corresponds to "0".

Figure 4:
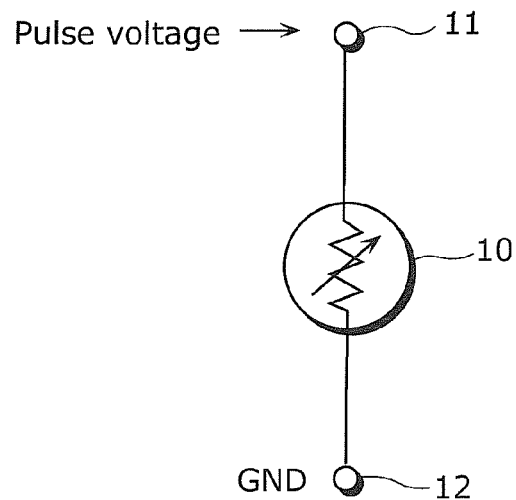
FIG. 4 is a diagram which shows: a configuration example of a circuit that causes the variable resistance element according to Embodiment 1 of the present invention to operate; and an operation example when data is written into the variable resistance element.

FIG. 4 shows a configuration example of a circuit which causes the variable resistance element 10 according to the Embodiment 1 of the present invention to operate, and an operation example when data is written into the variable resistance element 10. As shown in FIG. 4, the circuit includes: the variable resistance element 10; a first terminal 11; and a second terminal 12. The second electrode 4 of the variable resistance element 10 is electrically connected to the first terminal 11 and the first electrode 2 is electrically connected to the second terminal 12.

Figure 5:
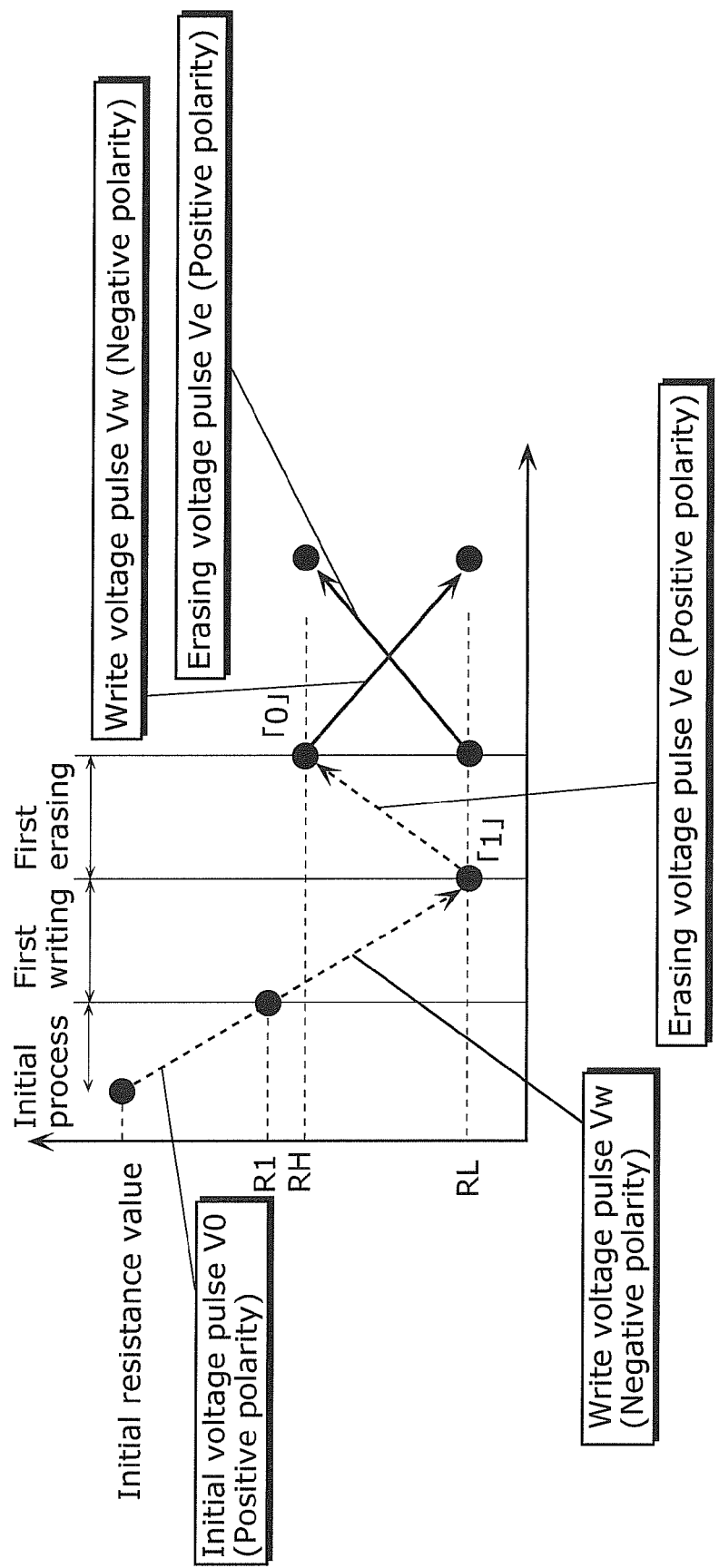
FIG. 5 is a diagram which shows change in a resistance value of the metal oxide layer at the time of: writing data in the variable resistance element (writing process); erasing data from the variable resistance element (erasing process); and an initial process performed prior to a first writing, according to Embodiment 1 of the present invention.

FIG. 5 shows changes in the resistance value of the metal oxide layer 3 when data is written into (a writing process) and erased from (an erasing process) the variable resistance element 10 according to the Embodiment 1 of the present invention, and in an initial process performed prior to the first writing. It is to be noted that, in the writing process, the erasing process, and the initial process, the second terminal 12 is grounded (ground: GND) and voltage pulses are applied to the first terminal 11 as shown in FIG. 4. The voltage value of the voltage pulse is determined based on the first electrode 2 and a grounding point.

When an initial voltage pulse (a voltage value V0) having a positive polarity is applied to the first terminal 11 when the variable resistance element 10 is in the initial state (when the resistance value of the metal oxide layer 3 is an initial resistance value R0), the resistance value of the metal oxide layer 3 reduces from the initial resistance value R0 to a resistance value R1 (an initial process) as shown in FIG. 5. Next, when a writing voltage pulse (a voltage value Vw) having a negative polarity is applied to the first terminal 11, the resistance value of the metal oxide layer 3 reduces from the resistance value R1 to a low resistance value RL (the first writing process) as shown in FIG. 5. With this, one bit data representing "1" is programmed. Next, when an erasing voltage pulse (a voltage value Ve) having a positive polarity is applied to the first terminal 11, the resistance value of the metal oxide layer 3 increases from the low resistance value RL to a high resistance value RH (the first erasing process). With this, one bit data representing "0" is programmed.

It is to be noted that, since the initial resistance value R0 is the highest resistance value of the metal oxide layer 3 and the high resistance value RH is higher than the low resistance value RL, R0>RH>RL is satisfied. In addition, in the present embodiment, the resistance value R1 after the initial process is equal to or higher than the high resistance value RH, and R0>R1≧RH>RL is satisfied.

Then, when the writing voltage pulse (the voltage value Vw) having the negative polarity is applied to the first terminal 11 when the resistance value of the metal oxide layer 3 is the high resistance value RH, the resistance value of the metal oxide layer 3 changes from the high resistance value RH to the low resistance value RL. On the other hand, when the erasing voltage pulse (the voltage value Ve) having the positive polarity is applied to the first terminal 11 when the resistance value of the metal oxide layer 3 is the low resistance value RL, the resistance value of the metal oxide layer 3 changes from the low resistance value RL to the high resistance value RH.

In this circuit as well, by applying the voltage pulse to the first terminal 11 so that |V0|>|Ve|≧|Vw| is satisfied, the variable resistance element 10 functions as a memory that operates stably at high speed, as described above.

Figure 6:
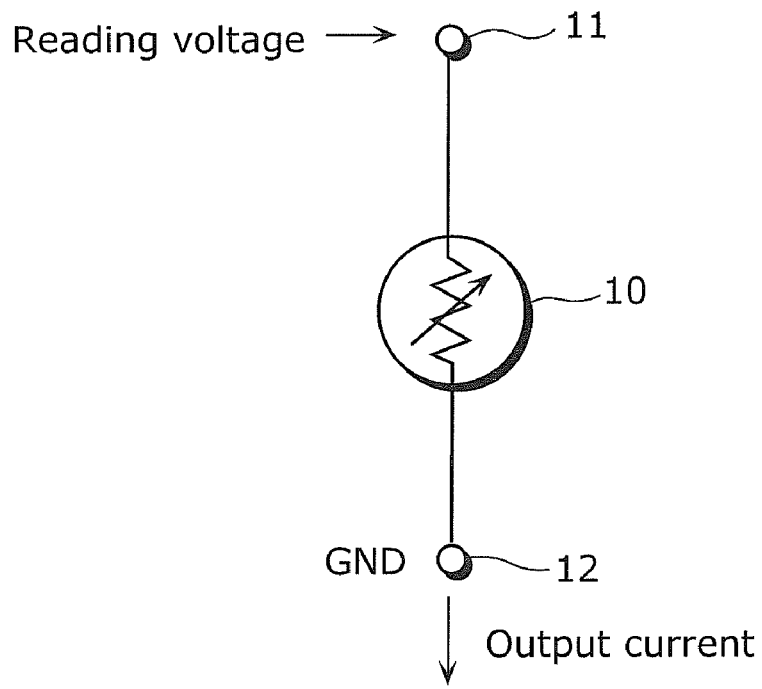
FIG. 6 is a diagram which shows: a configuration example of a circuit that causes the variable resistance element according to Embodiment 1 of the present invention to operate; and an operation example when reading data written in the variable resistance element.

FIG. 6 shows a configuration example of a circuit which causes the variable resistance element 10 according to the Embodiment 1 of the present invention to operate, and an operation example when reading data programmed in the variable resistance element 10. As shown in FIG. 6, when reading data, the second terminal 12 is grounded (ground: GND), a reading voltage is applied to the first terminal 11, and the second terminal 12 outputs an output current. The reading voltage is a voltage that is determined based on the first electrode 2 and the grounding point, and does not change the resistance of the variable resistance element 10 even when applied to the variable resistance element 10

Figure 7:
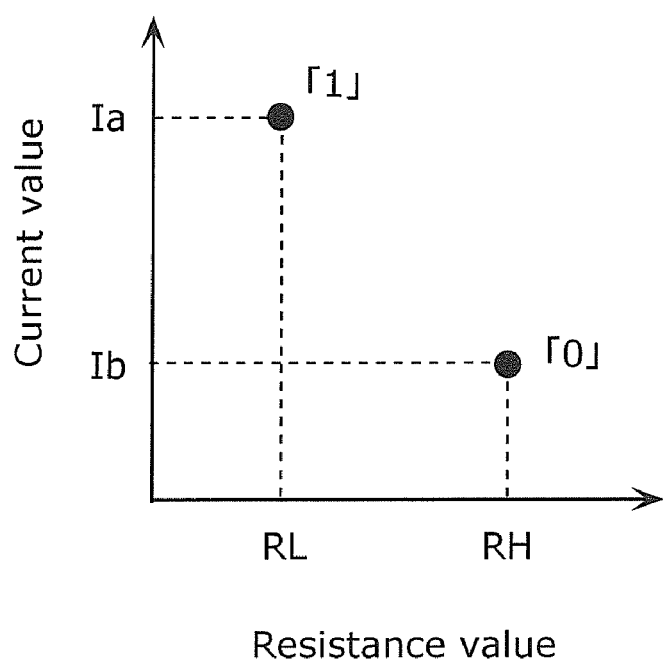
FIG. 7 is a diagram which shows a relationship between a resistance value of the metal oxide layer and a value of a current flowing through the circuit provided with the variable resistance element according to Embodiment 1 of the present invention, at the time of reading data.

FIG. 7 shows a relationship between the resistance value of the metal oxide layer 3 and a current value of the output current flowing, when reading data, through a circuit including the variable resistance element 10 according to the Embodiment 1 of the present invention. When the reading voltage is applied to the first terminal 11, an output current corresponding to the resistance value of the metal oxide layer 3 flows through the circuit. More specifically, as shown in FIG. 7, an output current having a current value Ia flows through the circuit when the metal oxide layer 3 has the low resistance value RL, and an output current having a current value Ib flows through the circuit when the metal oxide layer 3 has the high resistance value RH.

As shown in FIG. 6, when the second terminal 12 is grounded and reading voltage of, for example, +0.5V is applied to the first terminal 11, it is possible to determine whether the resistance value of the metal oxide layer 3 is the high resistance or the low resistance, by detecting the current value of the output current flowing between the first terminal 11 and the second terminal 12. More specifically, when the current value that has been detected is Ia, the resistance value of the metal oxide layer 3 is determined as the low resistance value RL. As a result, it is found that the data programmed into the variable resistance element 10 is "1". On the other hand, when the current value that has been detected is Ib, the resistance value of the metal oxide layer 3 is determined as the high resistance value RH. As a result, it is found that the data programmed into the variable resistance element 10 is "0". The data programmed into the variable resistance element 10 is read as described above.

The resistance value of the variable resistance element 10 does not change even when the power source is turned off. Thus, employing the variable resistance element 10 makes it possible to implement a nonvolatile storage device.

Figure 8:
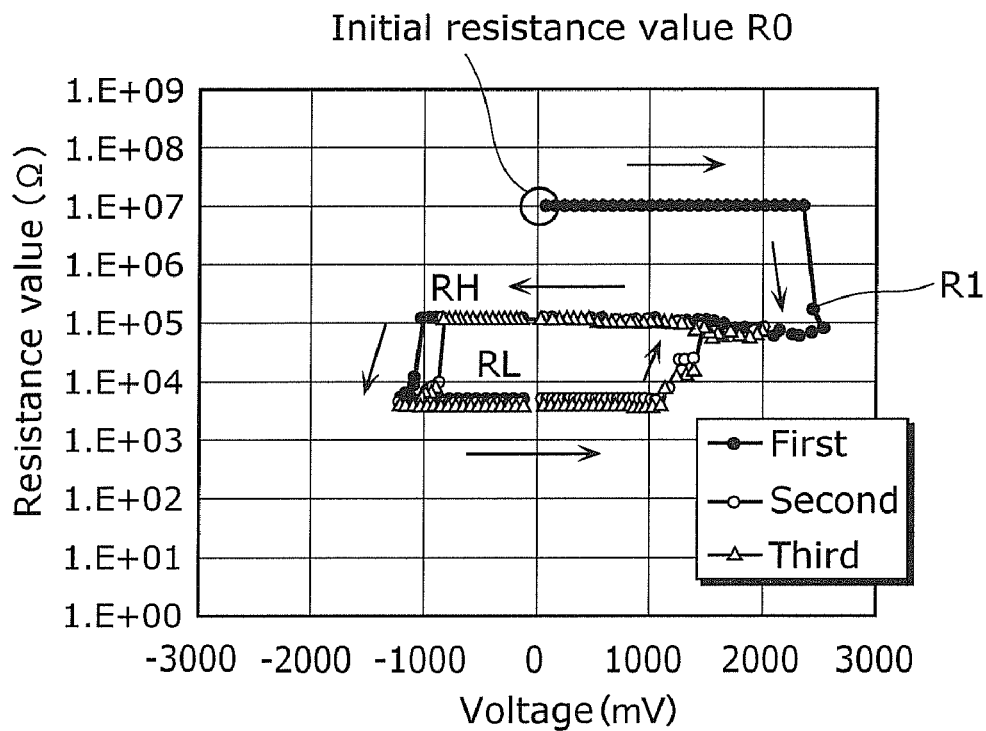
FIG. 8 is a graph which shows change in a resistance value of the metal oxide layer when voltage values of voltage pulses applied to the variable resistance element according to Embodiment 1 of the present invention are changed.

FIG. 8 is a graph which shows changes in the resistance value of the metal oxide layer 3 when the voltage values of voltage pulses applied to the variable resistance element 10 according to Embodiment 1 of the present invention are changed.

As shown in FIG. 8, the resistance value of the metal oxide layer 3 stays in the initial resistance value during a period in which the voltage value of the voltage pulse changes from 0 to approximately +2.5V, and rapidly reduces when the voltage value becomes approximately +2.5V to be the resistance value R1. Then, the resistance value of the metal oxide layer 3 stays in the high state (the high resistance value RH) during a period in which the voltage value of the voltage pulse changes from approximately +2.5V to −1.0V, and rapidly reduces when the voltage value becomes approximately −1.0V to be the low resistance value RL. After that, the resistance value of the metal oxide layer 3 stays in the low state (the low resistance value RL) during a period in which the voltage value of the voltage pulse changes from approximately −1.2V to 0V. The description thus far presented is shown by the trajectory of points indicated as "First" in FIG. 8.

Then, the resistance value of the metal oxide layer 3 stays in the low state during a period in which the voltage value of the voltage pulse changes from 0V to approximately +1.0V, and rapidly increases when the voltage value becomes approximately +1.0V. Then, the resistance value of the metal oxide layer 3 stays in the high state during a period in which the voltage value of the voltage pulse changes from approximately +1.5V to approximately −0.8V, and rapidly reduces when the voltage value becomes approximately −0.8V to be the low resistance value RL. After that, the resistance value of the metal oxide layer 3 stays in the low state during a period in which the voltage value of the voltage pulse changes from approximately −0.8V to 0V. The description thus far presented is shown by the trajectory of points indicated as "Second" in FIG. 8. It is to be noted that the trajectory of points indicated as "Third" is the same as in "Second".

Above results show that it is possible to obtain stable change in resistance by performing the initial process, the writing process, and the erasing process with the voltage value V0 of the initial voltage pulse, the voltage value Vw of the writing voltage pulse, and the voltage value Ve of the erasing voltage pulse set at approximately +2.5V, approximately −1.2V, and approximately +1.5V, respectively. Thus, in the present embodiment, the voltage value V0 of the initial voltage pulse, the voltage value Vw of the writing voltage pulse, and the voltage value Ve of the erasing voltage pulse are set at +2.5V, −1.2V, and +2.0V, respectively, as described above with reference to FIG. 3

It is to be noted that when the second tantalum oxide layer 3b is thicker or the first tantalum oxide layer 3a has higher resistance, it is necessary to increase the voltage value of each of the voltage pulses. Increasing the resistance of the second tantalum oxide layer 3b allows the difference between the high resistance value RH and the low resistance value RL to be expanded, making it possible to increase a read margin. In addition, increasing the resistance of the first tantalum oxide layer 3a does not change the difference between the high resistance value RH and the low resistance value RL but allows the low resistance value RL to be increased, making it possible to reduce current consumption.

Figure 9:
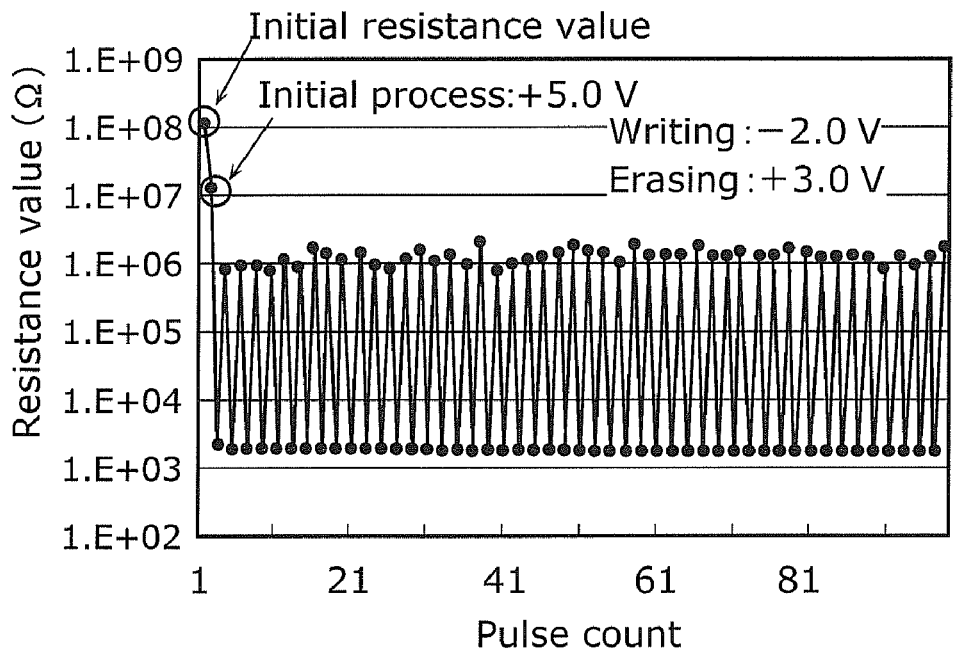
FIG. 9 is a graph which shows an example of change in a resistance state of the metal oxide layer in which the second tantalum oxide layer has a thickness of 6.2 nm.

FIG. 9 is a graph which shows an example of change in a resistance state of a metal oxide layer 3 in which the second tantalum oxide layer 3b has a thickness of 6.2 nm. In this example, each of the voltage values of the initial voltage pulse, the writing voltage pulse, and the erasing voltage pulse, is higher than a corresponding one of the voltage values shown in the example of FIG. 3. More specifically, the voltage value V0 of the initial voltage pulse, the voltage value Vw of the writing voltage pulse, and the voltage value Ve of the erasing voltage pulse are set at +5.0 V, −2.0 V, and +3.0 V, respectively. In this case as well, it is possible to confirm that the resistance state of the metal oxide layer 3 stably changes, as in the example shown in FIG. 3.

The following shows three examples as comparison examples for the present embodiment. It is to be noted that descriptions for the configuration of the variable resistance element in the comparison examples 1 to 3 below are omitted because it is the same as the configuration of the variable resistance element 10 according to the present embodiment (the second tantalum oxide layer 3b has a thickness of 5.0 nm).

COMPARISON EXAMPLE 1

Figure 10:
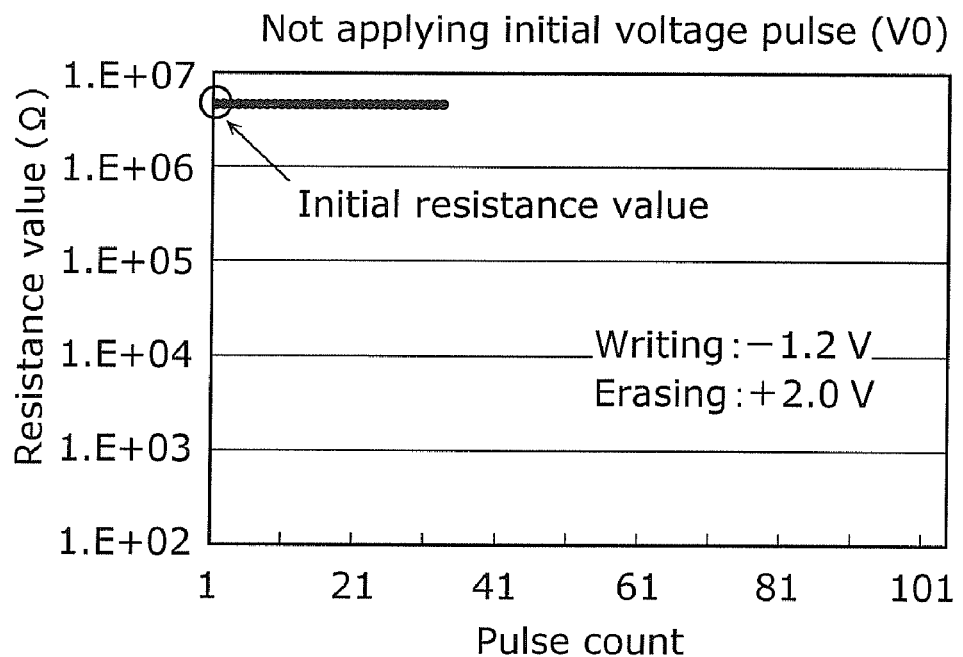
FIG. 10 is a graph which shows an example of change in the resistance state of the metal oxide layer included in the variable resistance element according to Comparison example 1.

FIG. 10 is a graph which shows an example of change in the resistance state of a metal oxide layer included in a variable resistance element according to Comparison example 1. In Comparison example 1, unlike the case of the present embodiment, an initial process in which an initial voltage pulse is applied between the electrodes is not carried out. More specifically, a writing process in which a writing voltage pulse having a voltage value of −1.2 V and a pulse width of 100 ns is applied between the first electrode 2 and the second electrode 4 and an erasing process in which an erasing voltage pulse having a voltage value of +2.0 V and a pulse width of 100 ns is applied between the first electrode 2 and the second electrode 4 are merely performed repeatedly.

In Comparison example 1, the resistance value of the metal oxide layer remains at the initial resistance value, and thus there is no change in the resistance state, as shown in FIG. 10. Thus, the variable resistance element in the state shown in Comparison example 1 cannot be used as a memory.

COMPARISON EXAMPLE 2

Figure 11:
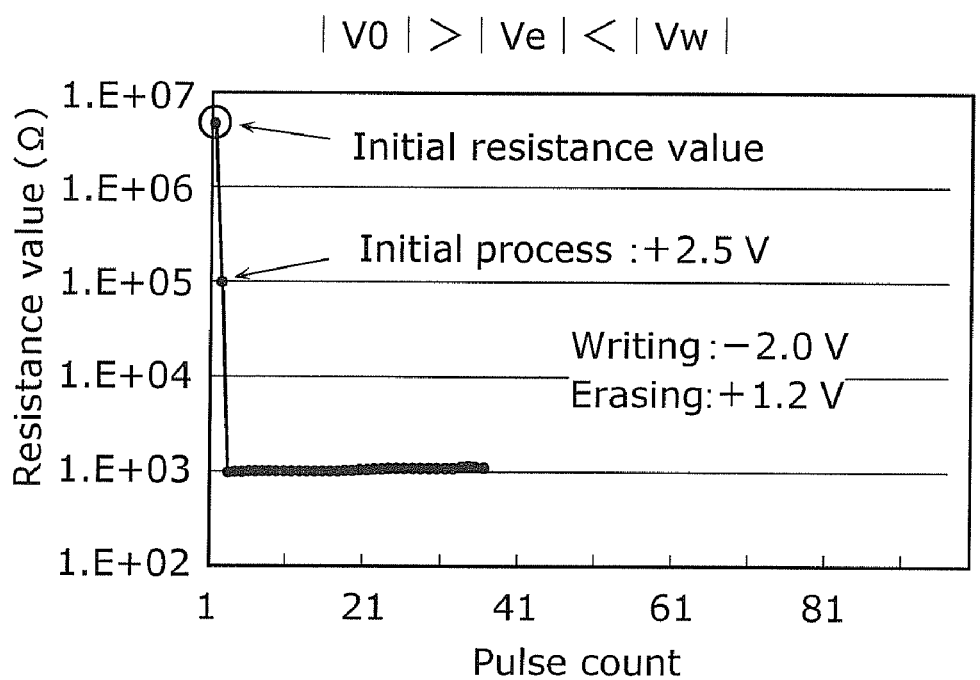
FIG. 11 is a graph which shows an example of change in the resistance state of the metal oxide layer included in the variable resistance element according to Comparison example 2.

FIG. 11 is a graph which shows an example of change in the resistance state of the metal oxide layer included in the variable resistance element according to Comparison example 2. In Comparison example 2, unlike the case of the present embodiment, the voltage values of the initial voltage pulse, the writing voltage pulse, and the erasing voltage pulse are in a relationship represented by $|V0|>|Ve|<|Vw|$. More specifically, the voltage value of the initial voltage pulse, the voltage value of the writing voltage pulse, and the voltage value of the erasing voltage pulse are set at +2.5 V, −2.0 V, and +1.2 V, respectively. It is to be noted that each of the voltage pulses has the pulse width of 100 ns.

In Comparison example 2, the resistance value of the metal oxide layer is reduced from the initial resistance value by performing the initial process in which the initial voltage pulse is applied between the electrodes, and then the resistance value is further reduced through the first writing process, however, the resistance state doest not change after that, even when the writing process and the erasing process are repeated, as shown in FIG. 11. Thus, the variable resistance element in the state shown in Comparison example 2 cannot be used as a memory.

COMPARISON EXAMPLE 3

Figure 12:
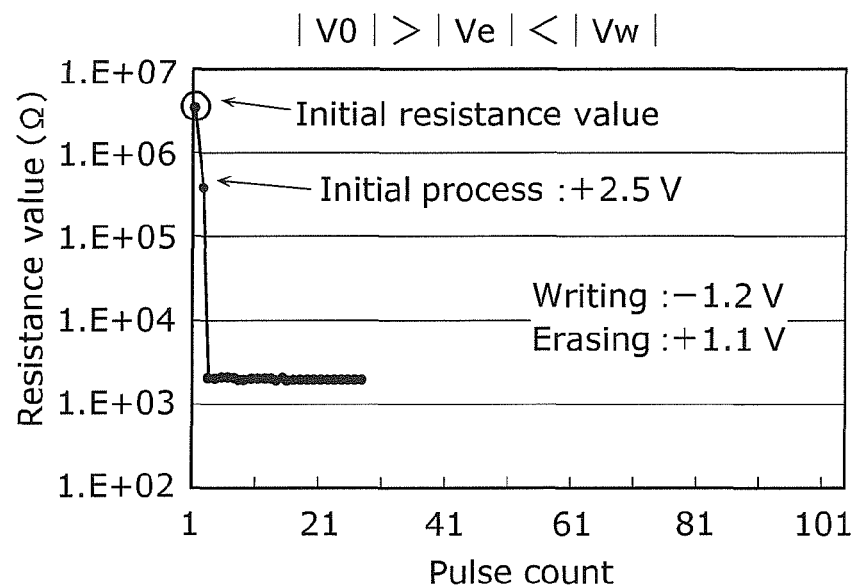
FIG. 12 is a graph which shows another example of change in the resistance state of the metal oxide layer included in the variable resistance element according to Comparison example 3.

FIG. 12 is a graph which shows another example of change in the resistance state of a metal oxide layer included in a variable resistance element according to Comparison example 3. In this Comparison example 3 as well, the voltage value of each of the voltage pulses is in a relationship represented by $|V0|>|Ve|<|Vw|$. More specifically, the voltage value of the initial voltage pulse, the voltage value of the writing voltage pulse, and the voltage value of the erasing voltage pulse are set at +2.5 V, −1.2 V, and +1.1 V, respectively. It is to be noted that each of the voltage pulses has the pulse width of 100 ns.

In Comparison example 3 as well, the resistance value of the metal oxide layer is reduced from the initial resistance value by performing the initial process in the same manner as in Comparison example 2, and then the resistance value is further reduced through the first writing process, however, the resistance state does not change after that even when the writing process and the erasing process are repeated, as shown in FIG. 12. Thus, the variable resistance element in the state shown in Comparison example 3 cannot be used as a memory, either.

As seen from above-described Comparison examples 1 to 3, when the initial process is not performed and when the voltage values of the initial voltage pulse, the writing voltage pulse, and the erasing voltage pulse are not in the relationship represented by $|V0|>|Ve|\geq|Vw|$, the variable resistance element that can operate stably cannot be implemented.

It is to be noted that, in the present embodiment described with reference to FIG. 3 and FIG. 9, although the relationship represented by $|V0|>|Ve|\geq|Vw|$ is satisfied, the relationship represented by $|V0|>|Ve|=|Vw|$ is not satisfied. The following describes a modification example of the present embodiment in the case where the relationship represented by $|V0|>|Ve|=|Vw|$ is satisfied.

[Modification]

Figure 13:
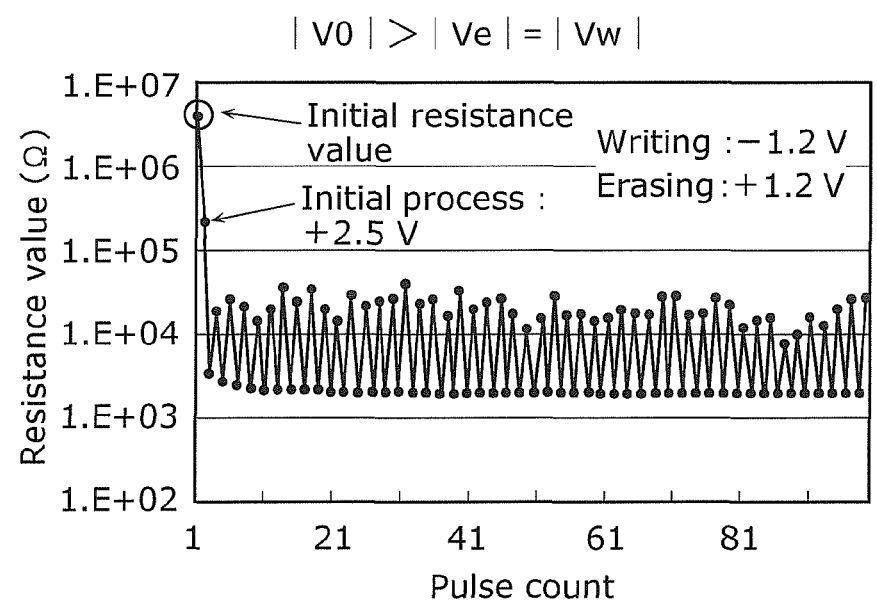
FIG. 13 is a graph which shows an example of change in the resistance state of the metal oxide layer included in the variable resistance element in a modification example according to Embodiment 1 of the present invention.

FIG. 13 is a graph which shows an example of change in the resistance state of the metal oxide layer included in the variable resistance element of a modification example according to Embodiment 1 of the present invention. In this modification example, the voltage values of the initial voltage pulse, the writing voltage pulse, and erasing voltage pulse are in a relationship represented by $|V0|>|Ve|=|Vw|$. More specifically, the voltage value of the initial voltage pulse, the voltage value of the writing voltage pulse, and the voltage value of the erasing voltage pulse are set at +2.5 V, −1.2 V, and +1.2 V, respectively. It is to be noted that each of the voltage pulses has the pulse width of 100 ns.

In Modification example, as shown in FIG. 13, the difference between the high resistance state and the low resistance state is small compared to the cases shown in FIG. 3 and FIG. 9, and the resistance value in the high resistance state is uneven, however, the resistance state of the metal oxide layer changes between the high resistance and the low resistance. Thus, when the variable resistance element of Modification example is used as a memory, although the stability is low compared to the case where the relationship represented by $|V0|>|Ve|>|Vw|$ is satisfied, it is possible to implement operation that can sufficiently be used for a practical use.

(Embodiment 2)

A nonvolatile storage device including the variable resistance element described in Embodiment 1 is described in Embodiment 2. The following describes a configuration and an operation of the nonvolatile storage device according to Embodiment 2.

[Configuration of a Nonvolatile Storage Device]

Figure 14:
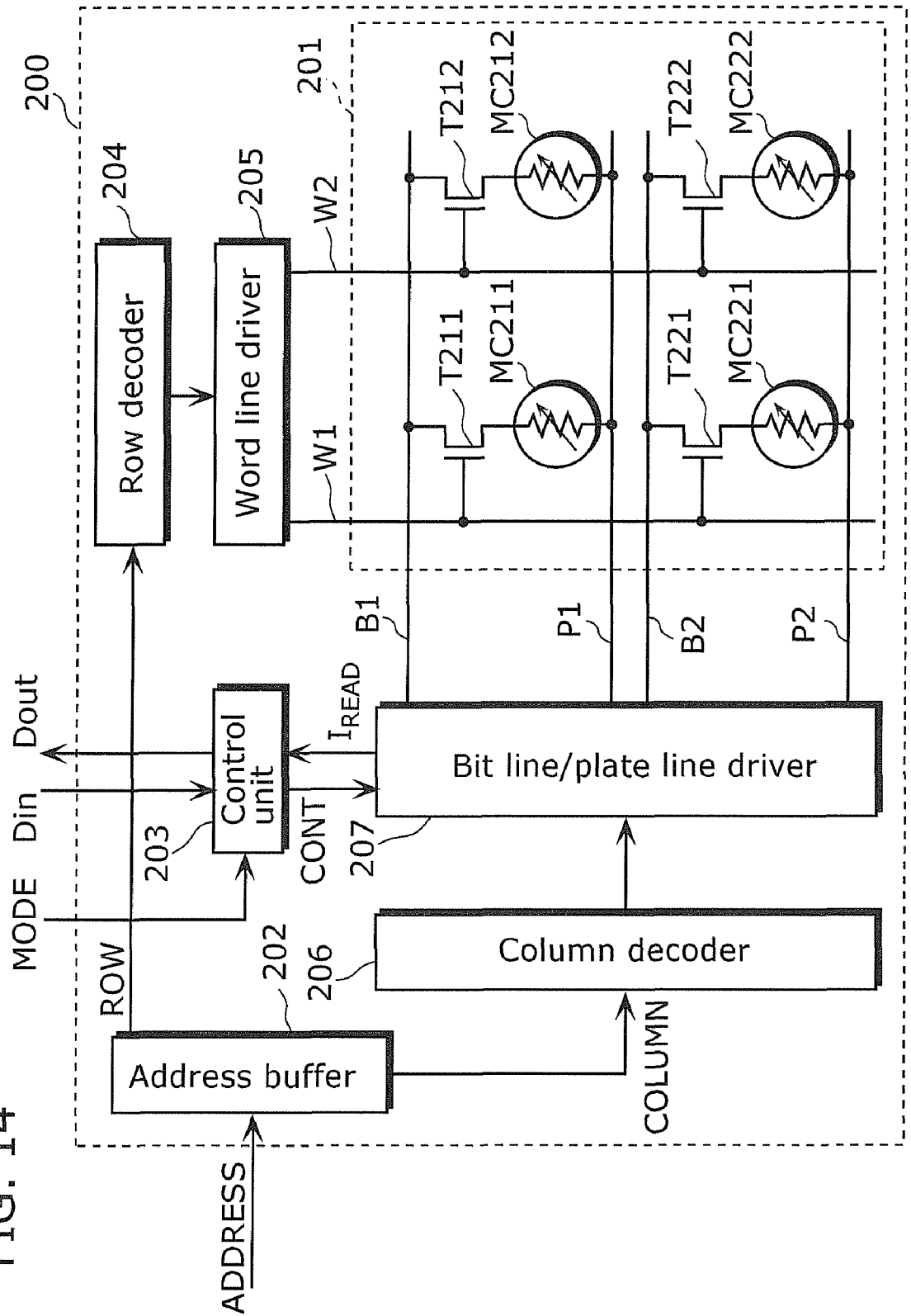
FIG. 14 is a block diagram which shows an example of a configuration of a nonvolatile storage device according to Embodiment 2 of the present invention.

FIG. 14 is a block diagram which shows an example of a configuration of a nonvolatile storage device according to Embodiment 2 of the present invention. A storage device 200 includes: a memory array 201 having a variable resistance element and an access transistor (current steering element); an address buffer 202; a control unit 203; a row decoder 204; a word line driver 205; a column decoder 206; and a bit line/plate line driver 207, as shown in FIG. 14. Furthermore, the bit line/plate line driver 207 includes a sensing circuit capable of measuring a current flowing through the bit line or the plate line and a voltage generated.

As shown in FIG. 14, the memory array 201 includes: two word lines W1 and W2; two bit lines B1 and B2; two plate lines P1 and P2; four access transistors T211, T212, T221, and T222; variable resistance elements MC211, MC212, MC221, and MC222. The word lines W1 and W2 are arranged to extend lengthwise. The bit lines B1 and B2 are arranged to extend crosswise and intersect with the word lines W1 and W2. The plate lines P1 and P2 are arranged to extend crosswise and correspond to the bit lines B1 and B2, respectively. The access transistors T211, T212, T221, and T222 are arranged in a matrix and each of the access transistors corresponds to a corresponding one of intersections of the word lines W1 and W2 and the bit lines B1 and B2. The memory cells MC211, MC212, MC221, and MC222 are arranged in a matrix and correspond to the transistors T211, T212, T221, and T222, respectively. The variable resistance element 10 shown in FIG. 1 in Embodiment 1 can be employed for the variable resistance elements MC211, MC212, and MC222. More specifically, the variable resistance elements are variable resistance elements each including the first electrode 2, the metal oxide layer 3, and the second electrode 4 shown in FIG. 1. A source or a drain of each of the access transistors T211, T212, T221, and T222 is electrically connected to one of the first electrode 2 and the second electrode 4 of a corresponding one of the variable resistance elements. It is to be noted that each of the word line driver 205 and the bit line/plate line driver 207 corresponds to a pulse voltage applying unit that applies a predetermined pulse voltage between the first electrode and the second electrode of the variable resistance element.

It is to be noted that the number of each of the components is presented for simplification and not limited to the above. For instance, the memory array 201 includes four variable resistance elements as described above, however, this merely is an example and may include, for example, five or more variable resistance elements.

The variable resistance elements MC211, MC212, MC221, and MC222 correspond to the elements described with reference to FIG. 4 in Embodiment 1. The following further describes the configuration of the memory array 201 with also reference to FIG. 4. The access transistor T211 and the variable resistance element MC211 are provided between the bit line B1 and the plate line P1 and arranged in series such that a source of the access transistor 211 and the terminal 11 of the variable resistance element MC211 are connected to each other. More specifically, the access transistor T211 is placed between the bit line B1 and the variable resistance element MC211 and connected to the bit line B1 and the variable resistance element MC211, and the variable resistance element MC211 is placed between the access transistor T211 and the plate line P1 and connected to the access transistor T211 and the plate line P1. Furthermore, the gate of the access transistor T211 is connected to the word line W1. The plate line P1 is placed parallel to the bit line B1 and connected to the bit line/plate line driver 207 in FIG. 14, however, the plate line P1 may be placed parallel to the word line W1 and connected to a word line/plate line driver placed instead of the word line driver 205. A voltage on the plate line P1 may be fixed, or may be changed using a driver.

It is to be noted that a connection status of three other access transistors T212, T221, and T222 and three variable resistance elements MC 212, MC221, and MC222 arranged in series with the access transistors T212, T221, and T222, respectively, is not described because it is the same as the connection status of the access transistor T211 and the variable resistance element MC 211.

With the above configuration, when a predetermined voltage (activation voltage) is applied to gates of each of the transistors T211, T212, T221, and T222 via the word lines W1 or W2, conduction between a drain and a source of each of the transistors T211, T212, T221, and T22 is achieved The address buffer 202 receives address signals ADDRESS from an external circuit (not shown), and then, based on the received address signals ADDRESS, provides row address signals ROW to the row decoder 204 and column address signals COLUMN to the column decoder 206. The address signals ADDRESS indicate an address of a variable resistance element selected from the variable resistance elements MC211, MC212, MC221, and MC222. In addition, the row address signals ROW are signals indicating an address of a row among the addresses indicated in the address signals ADDRESS. The column address signals COLUMN are signals indicating an address of a column among the addresses indicated in the address signals ADDRESS.

The control unit 203 selects one of an initial mode, a write mode, a reset (erase) mode, and a read mode, based on a mode selection signal MODE received from the external circuit. It is assumed hereafter that, in the case of voltage application, each voltage is applied based on a potential of the plate line.

In the initial mode, the control unit 203 issues a control signal CONT instructing to "apply an initial voltage", to the bit line/plate line driver 207. The initial mode is a mode selected before the first writing is carried out.

Furthermore, in the write mode, the control unit 203 issues, to the bit line/plate line driver 207, a control signal CONT instructing to "apply a write voltage" in response to input data Din received from the external circuit.

Furthermore, in the read mode, the control unit 203 issues, to the bit line/plate line driver 207, a control signal CONT instructing to "apply a read voltage". The control unit 203 further receives, in the read mode, signals $I_{READ}$ from the bit line/plate line driver 207, and provides the external circuit with output data Dout indicating a bit value corresponding to the signals $I_{READ}$. The signals $I_{READ}$ indicate a current value of a current flowing through the plate lines P1 and P2 in the read mode.

Furthermore, in the reset mode, the control unit 203 detects a write state of each of the variable resistance elements MC211, MC212, MC221, and MC222, and based on the write state, issues a control signal CONT instructing to "apply a reset voltage", to the bit line/plate line driver 207.

The row decoder 204 receives the row address signals ROW provided by the address buffer 202, and based on the row address signals ROW, selects one of the two word lines W1 and W2. Based on the output signal of the row decoder 204, the word line driver 205 applies an activation voltage to the word line selected by the row decoder 204.

The column decoder 206 receives the column address signals COLUMN provided by the address buffer 202, and based on the column address signals COLUMN, selects one of the two bit lines B1 and B2 and also selects one of the two plate lines P1 and P2 corresponding to the selected bit line.

When the bit line/plate line driver 207 receives the control signal CONT instructing to "apply an initial voltage" from the control unit 203, the bit line/plate line driver 207 applies the initial voltage $V_{INITIAL}$ between each of the bit lines and the plate lines so that the initial voltage pulse V0 is applied to each of the variable resistance elements MC211, MC212, MC221, and MC222.

When the bit line/plate line driver 207 receives the control signal CONT instructing to "apply a write voltage" from the control unit 203, the bit line/plate line driver 207 applies, based on the output signal of the column decoder 206, $V_{WRITE}$ between the bit line and the plate line selected by the column decoder 206 so that a writing voltage pulse Vw is applied to the selected variable resistance element MC (MC211, for example).

When the bit line/plate line driver 207 receives the control signal CONT instructing to "apply a read voltage" from the control unit 203, the bit line/plate line driver 207 applies, based on the output signal of the column decoder 206, $V_{read}$ between the bit line and the plate line selected by the column decoder 206 so that a read voltage pulse Vr is applied to the selected variable resistance element MC (MC211, for example). Then, the bit line/plate line driver 207 provides the control unit 203 with the signals $I_{READ}$ indicating the current value of a current flowing through the plate line.

Furthermore, when the bit line/plate line driver 207 receives the control signal CONT instructing to "apply a reset voltage" from the control unit 203, the bit line/plate line driver 207 applies, based on the output signal of the column decoder 206, $V_{RESET}$ between the bit line and the plate line selected by the column decoder 206 so that an erasing voltage pulse Ve is applied to the selected variable resistance element MC (MC211, for example).

Here, the initial voltage V0 is set, for example, to have a voltage value of +2.5 V and a pulse width of 100 ns. Furthermore, the write voltage Vw is set, for example, to have a voltage value of −1.2 V and a pulse width of 100 ns. Furthermore, the read voltage Vr is set, for example, to have a voltage value of +0.5 V. Furthermore, the reset voltage Ve is set, for example, to have a voltage value of +2.0 V and a pulse width of 100 ns.

$V_{INITIAL}$, $V_{WRITE}$, $V_{READ}$, and $V_{RESET}$ have a voltage value same as or greater than a voltage value obtained by adding a dropped voltage value resulting from on-resistance of the access transistor to the above-described voltage values V0, Vw, Vr, and Ve, respectively.

[Operation of a Nonvolatile Storage Device]

The following describes an operation example of the storage device 200 configured as described above, in each of the above-descried modes of: the initial mode (a mode selected prior to the first writing); the write mode (a mode in which input data Din is written into the variable resistance element); the reset mode (a mode in which data written into the variable resistance element is reset (erased)); and the read mode (a mode in which data written into the variable resistance element is output (read) as output data Dout). Here, the abovementioned initial process corresponds to the initial mode, the write process corresponds to the write mode, and the erasing process corresponds to the reset mode.

It is to be noted that the address signals ADDRESS are assumed to be signals indicating an address of the variable resistance element MC211, for the sake of convenience.

[Initial Mode]

The control unit 203 issues a control signal CONT instructing to "apply an initial voltage", to the bit line/plate line driver 207, prior to performing the first writing. The bit line/plate line driver 207, in response to the control signal CONT instructing to "apply an initial voltage" provided by the control unit 203, applies the initial voltage $V_{INITIAL}$ to each of the bit lines and connects each of the plate lines to ground.

As a result, voltage pulses having voltage values of the initial voltage $V_{INITIAL}$ and the pulse widths of 100 ns are applied to all of the variable resistance elements MC. With this, the resistance value of the metal oxide layer reduces from the initial resistance value R0 to the resistance value R1 in all of the variable resistance elements MC.

In the initial mode, plural variable resistance elements may be selected at one time or may be selected one by one in sequence, depending on the driver's capacity.

[Write Mode]

The control unit 203 receives input data Din from an external circuit. Here, the control unit 203 issues a control signal CONT instructing to "apply a write voltage", to the bit line/plate line driver 207 when the input data Din indicates "1". On the other hand, the control unit 203 does not issue the control signal CONT when the input data Din indicates "0".

The bit line/plate line driver 207, in response to the control signal CONT instructing to "apply a write voltage" provided by the control unit 203, applies voltage pulses having the voltage values of write voltages $V_{write}$ and the pulse widths of 100 ns between the bit line B1 selected by the column decoder 206 and the selected plate line P1.

At this time, an activation voltage is applied by the word line driver 205 to the word line W1 selected by the row decoder 204. Thus, a state between the drain and the source of the access transistor T211 is conductive.

As a result, a writing voltage pulse having the voltage value of a write voltage $V_{write}$ and the pulse width of 100 ns is applied to the variable resistance element MC211. With this, the resistance value of the metal oxide layer of the variable resistance element MC211 changes from the high resistance state to the low resistance state. On the other hand, the writing voltage pulse is not applied to variable resistance elements MC211 and MC222 which are not selected and the activation voltage is not applied to the gate of the access transistor T212 to which the variable resistance element MC 212 that is not selected is connected in series. Accordingly, the resistance state of any of the variable resistance elements MC212, MC221, and MC222 does not change.

As described above, it is possible to change only the selected variable resistance element MC211 into the low resistance state. With this, one bit data indicating "1" corresponding to the low resistance state is programmed in the variable resistance element MC211 (one bit data is stored).

It is to be noted that, when writing into the selected variable resistance element MC 211 is completed, new address signals ADDRESS are provided to the address buffer 202 and the operation of the storage device 200 in the write mode described above is repeatedly performed on the variable resistance elements other than the variable resistance element MC211.

[Read Mode]

The control unit 203 issues, to the bit line/plate line driver 207, a control signal CONT instructing to "apply a read voltage".

The bit line/plate line driver 207, in response to the control signal CONT instructing to "apply a read voltage" provided by the control unit 203, applies a read voltage $V_{READ}$ between the bit line B1 selected by the column decoder 206 and the selected plate line P1.

At this time, an activation voltage is applied by the word line driver 205 to the word line W1 selected by the row decoder 204. Therefore, conduction between the drain and the source of the access transistor T211 is achieved Thus, a voltage of +0.5V is applied to the selected variable resistance element MC211 as a reading voltage Vr. With this, a reading voltage corresponding to the resistance value of selected variable resistance element MC 211 flows from the bit line B1 to the plate line P1 via the selected variable resistance element MC211.

It is to be noted that the reading voltage is not applied to the variable resistance elements MC211 and MC222 which are not selected and the activation voltage is not applied to the gate of the access transistor T212 to which the variable resistance element MC212 that is not selected is connected in series. Accordingly, the above-described reading voltage does not flow through any of the variable resistance elements MC212, MC221, and MC222 which are not selected.

Next, the bit line/plate line driver 207 measures a current value of the reading current flowing through the bit line B1 or the plate line P1, and issues a signal $I_{READ}$ that indicates the measured value to the control unit 203.

The control unit 203 outputs, to the outside, output data Dout corresponding to the current value indicated in the signal $I_{READ}$. When the current value indicated in the signal $I_{READ}$ corresponds to the current value of the current that flows when the selected variable resistance element MC211 is in the low resistance state, for example, the control unit 203 provides output data Dout that indicates "1".

As described above, the reading current corresponding to the resistance value of the variable resistance element MC211 flows through only the selected variable resistance element MC211 and the reading current flows out to the plate line P1 from the bit line B1. With this, one bit data that indicates "1" is read from the selected variable resistance element MC211.

It is to be noted that, in measuring the resistance value of the variable resistance element MC211, a voltage may be measured in the process in which a voltage that is precharged into the variable resistance element MC211 in advance attenuates with time constant corresponding to the resistance value of the variable resistance element MC211 and the added capacity value.

When reading from the selected variable resistance element MC211 is completed, new address signals ADDRESS are provided to the address buffer 202 and the operation of the storage device 200 in the read mode described above is repeatedly performed on variable resistance elements other than the variable resistance element MC211.

[Reset Mode]

In the reset mode, the control unit 203 first obtains the state of the resistance value (storage state) of the selected variable resistance element MC211 by performing the read mode described above. Then, when it is determined that bit data indicating "1" is stored in the selected variable resistance element MC211 (in other words, when it is determined that the variable resistance element MC211 is in a low resistance state), the control unit 203 issues the control signal CONT indicating "apply a reset voltage" to the bit line/plate line driver 207. On the other hand, when it is determined that bit data indicating "0" is stored in the selected variable resistance element MC211 (in other words, when it is determined that the variable resistance element MC211 is in a high resistance state), then the control unit 203 does not issue the above control signal CONT.

The bit line/plate line driver 207, in response to the control signal CONT indicating "apply a reset voltage" from the control unit 203, applies a reset voltage $V_{RESET}$ between the bit line B1 selected by the column decoder 206 and the selected plate line P1.

At this time, an activation voltage is applied by the word line driver 205 to the word line W1 selected by the row decoder 204. Therefore, conduction between the drain and the source of the access transistor T211 is achieved.

As a result, a reset (erase) voltage Ve, that is, an erasing voltage pulse having the voltage value of +4.0V and the pulse width of 100 ns is applied to the selected variable resistance element MC211. With this, the selected variable resistance element MC211 changes from the low resistance state to the high resistance state. On the other hand, the erasing voltage pulse is not applied to variable resistance elements MC211 and MC222 which are not selected and the activation voltage is not applied to the gate of the access transistor T212 to which the variable resistance element MC212 that is not selected is connected in series. Accordingly, the resistance state of any of the variable resistance elements MC212, MC221, and MC222 does not change.

It is possible to change only the selected variable resistance element MC211 to the high resistance state, as described above. With this, one bit data indicating "1" which corresponds to the low resistance state and is stored in the variable resistance element MC211 is reset to "0" which corresponds to the high resistance state.

It is to be noted that, when resetting the selected variable resistance element MC211 is completed, new address signals ADDRESS are provided to the address buffer 202 and the operation of the storage device 200 in the reset mode described above is repeatedly performed on variable resistance elements other than the variable resistance element MC211.

The above-described operation allows a high-speed operation stably performed by the storage device 200. It is to be noted that, an example of the operation and the circuit in each of the modes is described above, however, other operations and circuits may be employed as long as an application of an initial voltage according to the present invention can be performed with the operation and the circuit configuration.

(Embodiment 3)

A cross point nonvolatile storage device including the variable resistance element described in Embodiment 1 is described in Embodiment 3. Here, the cross point nonvolatile storage device is a storage device in which each of active layers is provided at each of cross-points (three-dimensional cross-points) of each word lines and each bit lines.

The following describes a configuration and an operation of the nonvolatile storage device according to Embodiment 3.

[Configuration of a Nonvolatile Storage Device]

Figure 15:
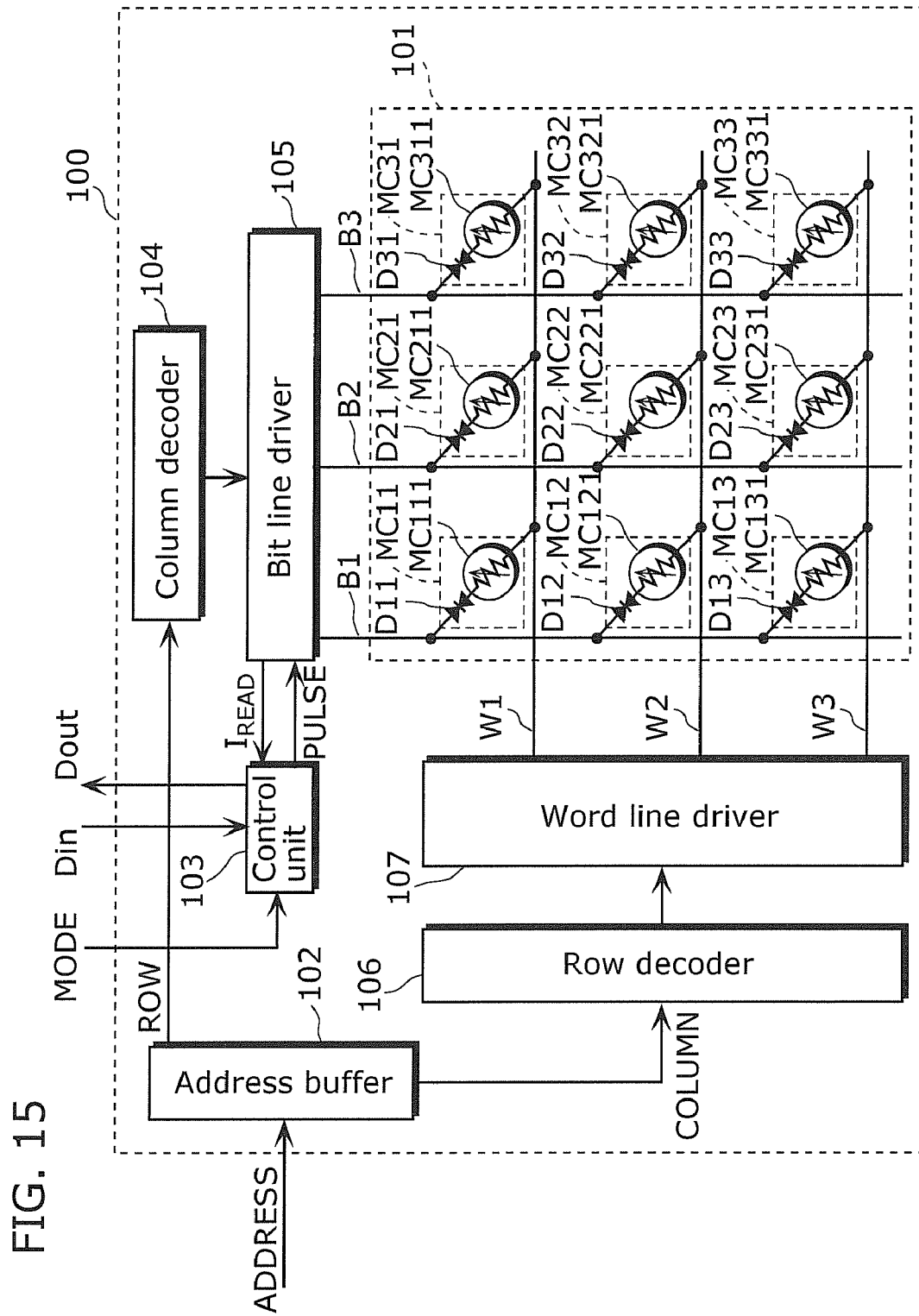
FIG. 15 is a block diagram which shows an example of a configuration of a nonvolatile storage device according to Embodiment 3 of the present invention.

FIG. 15 is a block diagram which shows an example of a configuration of a nonvolatile storage device according to Embodiment 3 of the present invention. As shown in FIG. 15, a cross point nonvolatile storage device 100 includes: a memory array 101 including variable resistance elements; an address buffer 102; a control unit 103; a row decoder 106; a word line driver 107; a column decoder 104, and a bit line driver 105. Furthermore, the bit line driver 105 includes a sensing circuit capable of measuring a current flowing through the bit line and a voltage generated.

As shown in FIG. 15, the memory array 101 includes plural word lines W1, W2, W3, . . . and plural bit lines B1, B2, B3, . . . . The word lines W1, W2, W3, . . . are arranged in parallel extending in a crosswise direction. The bit lines B1, B2, B3, . . . are arranged in parallel extending in a lengthwise direction and intersect with the word lines W1, W2, W3, .... Here, the word lines W1, W2, W3, . . . are arranged in a first plane parallel to a main plane of a substrate (not illustrated), and the bit lines B1, B2, B3, . . . are arranged in a second plane positioned above or below the first plane and substantially parallel to the first place. Thus, the word lines W1, W2, W3, . . . three-dimensionally cross the bit lines B1, B2, B3, . . . , and plural memory cells MC11, MC12, MC13, MC21, MC22, MC23, MC31, MC32, MC33, ... (hereinafter referred to as "memory cells MC11, MC12, . . . ") are provided for corresponding three-dimensional cross-points.

Each of the memory cells MC11, MC12, MC13, MC21, MC22, MC23, MC31, MC32, and MC33 includes a corresponding one of variable resistance elements MC111, MC121, MC131, MC211, MC221, MC231, MC311, MC321, and MC331 and a corresponding one of current steering elements D11, D12, D13, D21, D22, D23, D31, D32, and D33. The current steering elements are electrically connected in series to the variable resistance elements and include, for example, bidirectional diodes. Each of the variable resistance elements is connected to a corresponding one of the word lines W1, W2, W3, . . . , and each of the current steering elements is connected to a corresponding one of the bit lines B1, B2, B3, . . . . It is to be noted that the variable resistance element 10 according to Embodiment 1 can be used as the variable resistance element described above. In addition, an MIM (metal insulator metal) diode, an MSM (metal semiconductor metal) diode, a varistor or the like can be used as the current steering element.

The address buffer 102 receives address signals ADDRESS from an external circuit (not shown), and then, based on the received address signals ADDRESS, provides row address signals ROW to the row decoder 106 and column address signals COLUMN to the column decoder 104. Here, the address signals ADDRESS indicate an address of a memory cell selected from among the memory cells MC11, MC12, MC21, . . . . In addition, the row address signals ROW indicate an address of a row of the address indicated in the address signals ADDRESS. The column address signals COLUMN indicate an address of a column of the address indicated in the address signals ADDRESS. It is to be noted that each of the word line driver 107 and the bit line driver 105 corresponds to a pulse voltage applying unit that applies a predetermined pulse voltage between the first electrode and the second electrode of the variable resistance element. The predetermined pulse voltage is a voltage equal to or larger than a sum of the value of voltage drop of the current steering element at the time when the current is on and the value of voltage drop of the variable resistance element at the time of writing into or reading from the variable resistance element.

It is assumed hereafter that, in the case of voltage application, each voltage is applied based on the bit line.

The control unit 103 selects one mode from among: an initial mode (a mode selected prior to the first writing process); a write mode (corresponding to the write process and the erasing process above); and a read mode, according to a mode selection signal MODE received from an external circuit.

In the initial mode, the control unit 103 applies an initial voltage pulse to the word line driver 107 or the bit line driver, or to the both.

Furthermore, in the write mode, the control unit 103 applies a writing voltage pulse or an erasing voltage pulse to the word line driver 107 or the bit line driver, or to the both, according to input data Din received from the external circuit.

Furthermore, in the read mode, the control unit 103 applies a reading voltage to the word line driver 107, for example. The control unit 103 further receives, in the read mode, signals $I_{READ}$ from the bit line driver 105, and provides the external circuit with output data Dout indicating a bit value corresponding to the signals $I_{READ}$. The signals $I_{READ}$ indicate a current value of current flowing through the word lines W1, W2, W3, . . . , in the read mode.

The row decoder 106 receives the row address signals ROW provided by the address buffer 102, and based on the row address signals ROW, selects one of the word lines W1, W2, W3, . . . . Based on the output signal of the row decoder 106, the word line driver 107 applies an activation voltage to the word line selected by the row decoder 106.

The column decoder 104 receives the column address signals COLUMN provided by the address buffer 102 and selects one of the bit lines B1, B2, B3, . . . , based on the column address signals COLUMN.

The bit line driver 105 may connect the bit line selected by the column decoder 104 to ground, based on the output signal of the column decoder 104.

It is to be noted that a cross point storage device having a single layer of memory array is described in the present embodiment, however, a cross point storage device having multiple layers may be employed by stacking memory arrays.

In addition, the variable resistance element and the current steering element may exchange the positional relationship. More specifically, the bit line and the word line may be connected to the variable resistance element and the current steering element, respectively.

In addition, one or both of the bit line and the word line may also serve as an electrode in the variable resistance element.

[Operation of Nonvolatile Storage Device]

The following describes an operational example of the nonvolatile storage device 100 configured as described above, for each of the initial mode, the write mode, and the read mode. It is to be noted that, since known methods can be used for selecting a bit line or a word line and for applying voltage pulses, the methods are not described in detail below.

In the following example, writing and reading is performed on the memory cell MC22.

[Initial Mode]

In an initial mode, an initial voltage pulse V0 is applied to plural variable resistance elements at a time, or the initial voltage pulse V0 is applied to all of the variable resistance elements sequentially one by one. More specifically, each of the bit lines are grounded by the bit line driver 105, for example, and each of the word lines are electrically connected to the control unit 103 by the word line driver 107. Then an initial voltage $V_{INITIAL}$ is applied to each of the word lines by the control unit 103. Here, a voltage value of the initial voltage pulse V0 applied to the variable resistance element is set at +2.5V and the pulse width is set at 100 ns.

With the operation described above, the resistance value of the metal oxide layer reduces from the initial resistance value R0 to the resistance value R1 in all of the variable resistance elements.

[Write Mode]

When one bit data indicating "1" is programmed (stored) into the variable resistance element MC221, the bit line driver 105 connects the bit line B2 to ground and the word line driver 107 electrically connects the word line W2 to the control unit 103. Then, the control unit 103 applies a writing voltage pulse $V_{WRITE}$ to the word line W2. The voltage value of the writing voltage pulse Vw applied to the selected variable resistance element is set at −1.2 V and the pulse width is set to be 100 ns, for example.

With the above-described operation, a writing voltage pulse Vw is applied to the selected variable resistance element MC221. As a result, the variable resistance element MC221 turns to a low resistance state corresponding to "0".

On the other hand, when one bit data indicating "0" is programmed (reset or erased) into the selected variable resistance element MC221, the bit line driver 105 connects the bit line B2 to ground and the word line driver 107 electrically connects the word line W2 to the control unit 103. Then, the control unit 103 applies a reset (erase) voltage pulse $V_{RESET}$ to the word line W2. Here, the voltage value of the erasing voltage pulse Ve applied to the selected variable resistance element is set at +2.0 V and the pulse width is set to be 100 ns, for example.

With the above-described operation, an erasing voltage pulse Ve is applied to the selected variable resistance element MC221. As a result, the metal oxide layer of the variable resistance element MC221 turns to a high resistance state corresponding to "0".

[Read Mode]

When data written in the select variable resistance element MC221 is read, the bit line driver 105 connects the bit line B2 to ground and the word line driver 107 electrically connects the word line W2 to the control unit 103, for example. Then, the control unit 103 applies a read voltage $V_{READ}$ to the word line W2. Here, the voltage value of the read voltage Vr applied to the selected variable resistance element MC221 is set at +0.5 V.

When the read voltage Vr is applied to the variable resistance element MC221, a reading current $I_{READ}$ having a current value corresponding to a resistance value of the metal oxide layer of the variable resistance element MC221 flows between the bit line B2 and the word line W2. The control unit 103 detects a current value of the reading current $I_{READ}$ and detects the resistance state of the variable resistance element MC221 based on the current value and the read voltage Vr.

When the metal oxide layer of the selected variable resistance element MC221 is in the low resistance state, it is determined that data programmed in the variable resistance element MC221 is "1". On the other hand, when the metal oxide layer of the selected variable resistance element MC221 is in the high resistance state, it is determined that data programmed in the variable resistance element MC221 is "0".

The above-described operation allows a high-speed operation stably performed by the nonvolatile storage device 100.

It is to be noted that, the bit line is connected to ground and a predetermined voltage pulse is applied to the word line in the description above, however, the bit line and the word line may receive voltage pulses different from each other, so that a potential difference becomes a predetermined voltage.

It is to be noted that, an example of the operation and the circuit in each of the modes is described above; however, other operations and circuits may be employed as long as an application of an initial voltage according to the present invention can be performed with the operation and the circuit configuration.

(Other Embodiments)

The metal oxide layer is formed of tantalum oxide in a stacking structure in each of the Embodiments above, however, the present invention is not limited to the above. For example, the metal oxide layer may be formed of hafnium (Hf) oxide in a stacking structure or zirconium (Zr) oxide in a stacking structure.

In the case where the hafnium oxide in a stacking structure is employed, it is preferable, when the composition of a first hafnium oxide is represented by $HfO_x$ and a composition of the second hafnium oxide is represented by $HfO_y$, that the followings are satisfied: approximately $0.9 \leq x \leq 1.6$; approximately $1.8 \leq y \leq 2.0$; and the second hafnium oxide has a thickness of 3 nm or more and 4 nm or less.

Furthermore, in the case where the zirconium oxide in a stacking structure is employed, it is preferable, when the composition of a first zirconium oxide is represented by $ZrO_x$ and a composition of the second zirconium oxide is represented by $ZrO_y$, that the followings are satisfied: approximately $0.9 \leq x \leq 1.4$; approximately $1.9 \leq y \leq 2.0$; and the second zirconium oxide has a thickness of 1 nm or more and 5 nm or less.

Furthermore, in the case of the hafnium oxide, a first hafnium oxide layer is formed on the first electrode 2 using a so-called reactive sputtering method with which sputtering is performed in argon gas and oxygen gas, using an Hf target.

A second hafnium oxide layer can be formed by exposing the surface of the first hafnium oxide layer to plasma of the argon gas and the oxygen gas after forming the first hafnium oxide layer. The oxygen content percentage in the first hafnium oxide layer can be adjusted easily by changing a flow ratio of the oxygen gas to the argon gas in reactive sputtering. It is to be noted that the substrate does not have to be heated and the temperature of the substrate may be set at an ambient temperature.

In addition, the thickness of the second hafnium oxide layer can be adjusted easily by changing exposure time of the argon gas and the oxygen gas to plasma. In the case where the composition of the first hafnium oxide layer is represented by $HfO_x$ and the composition of the second hafnium oxide layer is represented by $HfO_y$, it is possible to implement stable variable resistance characteristics when the thickness of the second hafnium oxide layer is 3 nm or more and 4 nm or less and the followings are satisfied: $0.9 \leq x \leq 1.6$; and $1.8 \leq y \leq 2.0$.

In the case of the zirconium oxide, a first zirconium oxide layer is formed on the first electrode 2 using a so-called reactive sputtering method with which sputtering is performed in argon gas and oxygen gas, using a Zr target. A second zirconium oxide layer can be formed by exposing the surface of the first zirconium oxide layer to plasma of Ar gas and $O_2$ gas after forming the first zirconium oxide layer. The oxygen content percentage in the first zirconium oxide layer can be adjusted easily by changing a flow ratio of the oxygen gas to the argon gas in reactive sputtering. It is to be noted that the substrate does not have to be heated and the temperature of the substrate may be set at an ambient temperature.

In addition, the thickness of the second zirconium oxide layer can be adjusted easily by changing exposure time of the argon gas and the oxygen gas to plasma. In the case where the composition of the first zirconium oxide layer is represented by $ZrO_x$ and the composition of the second zirconium oxide layer is represented by $ZrO_y$, it is possible to implement stable variable resistance characteristics when the thickness of the second zirconium oxide layer is 1 nm or more and 5 nm or less and the followings are satisfied: $0.9 \leq x \leq 1.4$; and $1.9 \leq y \leq 2.0$.

It is to be noted that, it is possible to realize a stable operation for changing resistance as described above in each of the above-stated embodiments, however, programming fails in the writing process or the erasing process in an exceptionally rare case. In such a failure in programming, the initial process is carried out in which an initial voltage pulse is applied between the electrodes and then the writing process and the erasing process are repeated, thereby realizing a stable operation over a long period of time.

[Industrial Applicability]

The method of programming a variable resistance element and the nonvolatile storage device according to the present invention are useful as a method of programming a variable resistance element and a storage device used for a variety of electronic devices such as a personal computer, a mobile phone, and so on.

[Reference Signs List]
1. substrate
2. first electrode
3. metal oxide layer
3a first tantalum oxide layer
3b second tantalum oxide layer
4 second electrode
5 power source
10 variable resistance element
11 first terminal
12 second terminal
100 nonvolatile storage device
101 memory array
102 address buffer
103 control unit
104 column decoder
105 bit line driver
106 row decoder
107 word line driver
200 nonvolatile storage device
201 memory array
202 address buffer
203 control unit
204 row decoder
205 word line driver
206 column decoder
207 bit line/plate line driver
W1, W2, W3 word line
B1, B2, B3 bit line
MC111, MC121, MC131, MC211, MC221, MC231, MC311, MC321, MC331, MC211, MC212, MC213, MC214 variable resistance element MC11, MC12, MC13, MC21, MC22, MC23, MC31, MC32, MC33 memory cell
D11, D12, D13, D21, D22, D23, D31, D32, D33 current steering element
T211, T212, T221, T222 access transistor

The invention claimed is:

1. A method of programming a variable resistance element including: a first electrode; a second electrode; and a metal oxide disposed between the first electrode and the second electrode and having a resistance value that increases or decreases according to an electric pulse applied between the first electrode and the second electrode,
   wherein the metal oxide includes, in a stacking structure, a first oxide layer connected to the first electrode and a second oxide layer connected to the second electrode, the second oxide layer having an oxygen content percentage higher than that of the first oxide layer,
   said method of programming a variable resistance element comprising:
   applying a writing voltage pulse having a first polarity between the first and second electrodes to change the resistance state of the metal oxide from high to low so as to render the resistance state a write state;
   applying an erasing voltage pulse having a second polarity different from the first polarity between the first and second electrodes to change the resistance state of the metal oxide from low to high so as to render the resistance state an erase state;
   applying an initial voltage pulse having the second polarity between the first and second electrodes before said applying of a writing voltage pulse is performed for a first time, to change a resistance value of an initial state of the metal oxide, and
   applying again an initial voltage pulse having the second polarity between the first and second electrodes in the case where: the resistance state of the metal oxide fails to change from high to low even when the writing voltage pulse is applied between the first and second electrodes; or the resistance state of the metal oxide fails to change from low to high even when the erasing voltage pulse is applied between the first and second electrodes,
   wherein $R0>RH>RL$ and $|V0|>|Ve|\geq|Vw|$ are satisfied where $R0$ is the resistance value of the initial state of the metal oxide, $RL$ is the resistance value of the write state, $RH$ is the resistance value of the erase state, $V0$ is a voltage value of the initial voltage pulse, $Vw$ is a voltage value of the write voltage pulse, and $Ve$ is a voltage value of the erasing voltage pulse.

2. The method of programming a variable resistance element according to claim 1,
   wherein $R0>R1\geq RH>RL$ is satisfied where $R1$ is the resistance value of the metal oxide after said applying of an initial voltage pulse is performed.

3. The method of programming a variable resistance element according to claim 1,
   wherein the first oxide layer includes a tantalum oxide having a composition represented by $TaO_x$ where $0.8\leq x\leq 1.9$, and
   the second oxide layer includes a tantalum oxide having a composition represented by $TaO_y$ where $2.1\leq y\leq 2.5$.

4. A nonvolatile storage device comprising:
   a first electrode;
   a second electrode;
   a variable resistance element including a metal oxide disposed between said first electrode and said second electrode and having a resistance value that increases or decreases according to an electric pulse applied between said first electrode and said second electrode; and
   a pulse voltage applying unit configured to apply a predetermined pulse voltage to said variable resistance element,
   wherein said metal oxide includes, in a stacking structure, a first oxide layer connected to said first electrode and a second oxide layer connected to said second electrode, said second oxide layer having an oxygen content percentage higher than that of said first oxide layer,
   said pulse voltage applying unit is configured to (i) apply a writing voltage pulse having a first polarity between said first and second electrodes to change a resistance state of said metal oxide from high to low so as to render the resistance state a write state, (ii) apply an erasing voltage pulse having a second polarity different from the first polarity between said first and second electrodes to change the resistance state of said metal oxide from low to high so as to render the resistance state an erase state, (iii) apply an initial voltage pulse having the second polarity between said first and second electrodes before the writing voltage pulse is applied for a first time to change a resistance value of an initial state of said metal oxide, and (iv) apply again an initial voltage pulse having the second polarity between the first and second electrodes in the case where: the resistance state of the metal oxide fails to change from high to low even when the writing voltage pulse is applied between the first and second electrodes; or the resistance state of the metal oxide fails to change from low to high even when the erasing voltage pulse is applied between the first and second electrodes, and R0>RH>RL and |V0|>|Ve|≧|Vw| are satisfied where R0 is the resistance value of the initial state of said metal oxide, RL is the resistance value of the write state, RH is the resistance value of the erase state, V0 is a voltage value of the initial voltage pulse, Vw is a voltage value of the write voltage pulse, and Ve is a voltage value of the erasing voltage pulse.

5. The nonvolatile storage device according to claim 4, wherein R0>R1≧RH>RL is satisfied where R1 is the resistance value of said metal oxide after the initial voltage pulse is applied.

6. The nonvolatile storage device according to claim 4, wherein said first oxide layer includes a tantalum oxide having a composition represented by $TaO_x$ where $0.8 \leq x \leq 1.9$, and
said second oxide layer includes a tantalum oxide having a composition represented by $TaO_y$ where $2.1 \leq y \leq 2.5$.

7. The nonvolatile storage device according to claim 4 further comprising a current steering element electrically connected to said first electrode or said second electrode.

8. The nonvolatile storage device according to claim 7, wherein said current steering element is a transistor.

9. The nonvolatile storage device according to claim 7, wherein said current steering element is a diode.

* * * * *